(12) United States Patent
Sharangpani et al.

(10) Patent No.: US 9,698,223 B2
(45) Date of Patent: Jul. 4, 2017

(54) MEMORY DEVICE CONTAINING STRESS-TUNABLE CONTROL GATE ELECTRODES

(71) Applicant: SANDISK TECHNOLOGIES INC., Plano, TX (US)

(72) Inventors: Rahul Sharangpani, Fremont, CA (US); Raghuveer S. Makala, Campbell, CA (US); George Matamis, Danville, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 17 days.

(21) Appl. No.: 14/553,149

(22) Filed: Nov. 25, 2014

(65) Prior Publication Data

US 2016/0149002 A1    May 26, 2016

(51) Int. Cl.
*H01L 29/10* (2006.01)
*H01L 27/115* (2017.01)
(Continued)

(52) U.S. Cl.
CPC ...... *H01L 29/1054* (2013.01); *H01L 27/0207* (2013.01); *H01L 27/1157* (2013.01);
(Continued)

(58) Field of Classification Search
None
See application file for complete search history.

(56) References Cited

U.S. PATENT DOCUMENTS 5,084,417 A    1/1992    Joshi et al.
5,807,788 A    9/1998    Brodsky et al.
(Continued)

FOREIGN PATENT DOCUMENTS

WO    WO02/15277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Hoang-Quan Ho
(74) *Attorney, Agent, or Firm* — The Marbury Law Group PLLC

(57) ABSTRACT

A memory film and a semiconductor channel are formed within each memory opening that extends through a stack including an alternating plurality of insulator layers and sacrificial material layers. After formation of backside recesses through removal of the sacrificial material layers selective to the insulator layers, electrically conductive layers are formed in the backside recesses. Each electrically conductive layer includes a combination of a tensile-stress-generating metallic material and a compressive-stress-generating metallic material. The tensile-stress-generating metallic material may be ruthenium and the compressive-stress-generating metallic material may be tungsten. An anneal may be performed to provide an alloy of the compressive-stress-generating metallic material and the tensile-stress-generating metallic material.

27 Claims, 21 Drawing Sheets

(51) Int. Cl.

| | |
|---|---|
| *H01L 27/02* | (2006.01) |
| *H01L 27/11524* | (2017.01) |
| *H01L 27/11551* | (2017.01) |
| *H01L 27/1157* | (2017.01) |
| *H01L 27/11578* | (2017.01) |
| *H01L 27/11556* | (2017.01) |
| *H01L 27/11582* | (2017.01) |

(52) U.S. Cl.
CPC .. *H01L 27/11524* (2013.01); *H01L 27/11551* (2013.01); *H01L 27/11556* (2013.01); *H01L 27/11578* (2013.01); *H01L 27/11582* (2013.01)

(56) References Cited

U.S. PATENT DOCUMENTS

| | | | |
|---|---|---|---|
| 5,915,167 A | 6/1999 | Leedy | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,691,442 B2 | 4/2010 | Gandikota et al. | |
| 7,745,265 B2 | 6/2010 | Mokhlesi et al. | |
| 7,745,312 B2 | 6/2010 | Herner et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,187,936 B2 | 5/2012 | Alsmeier et al. | |
| 8,193,054 B2 | 6/2012 | Alsmeier | |
| 8,198,672 B2 | 6/2012 | Alsmeier | |
| 8,283,228 B2 | 10/2012 | Alsmeier | |
| 8,349,681 B2 | 1/2013 | Alsmeier et al. | |
| 8,445,347 B2 | 5/2013 | Alsmeier | |
| 8,461,000 B2 | 6/2013 | Alsmeier et al. | |
| 8,580,639 B2 | 11/2013 | Alsmeier et al. | |
| 8,625,322 B2* | 1/2014 | Samachisa | G11C 13/0002 365/130 |
| 8,765,543 B2 | 7/2014 | Alsmeier et al. | |
| 9,093,547 B2* | 7/2015 | Lee | H01L 29/7926 |
| 2007/0210338 A1 | 9/2007 | Orlowski | |
| 2007/0252201 A1 | 11/2007 | Kito et al. | |
| 2008/0096340 A1* | 4/2008 | Oh | H01L 21/02178 438/201 |
| 2010/0044778 A1 | 2/2010 | Seol | |
| 2010/0112769 A1 | 5/2010 | Son et al. | |
| 2010/0120214 A1* | 5/2010 | Park | H01L 27/11578 438/287 |
| 2010/0155810 A1* | 6/2010 | Kim | H01L 27/11548 257/316 |
| 2010/0155818 A1* | 6/2010 | Cho | H01L 27/11578 257/324 |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2012/0001247 A1* | 1/2012 | Alsmeier | H01L 27/11551 257/316 |
| 2012/0001249 A1 | 1/2012 | Alsmeier | |
| 2012/0001252 A1* | 1/2012 | Alsmeier | H01L 27/11551 257/321 |
| 2012/0147649 A1* | 6/2012 | Samachisa | G11C 13/0002 365/51 |
| 2012/0236649 A1* | 9/2012 | Ku | G11C 16/0483 365/185.18 |
| 2012/0256247 A1 | 10/2012 | Alsmeier | |
| 2013/0248974 A1* | 9/2013 | Alsmeier | G11C 16/04 257/321 |
| 2013/0264631 A1 | 10/2013 | Alsmeier et al. | |
| 2013/0313627 A1 | 11/2013 | Lee et al. | |
| 2014/0008714 A1 | 1/2014 | Makala et al. | |
| 2014/0131787 A1 | 5/2014 | Alsmeier | |
| 2014/0175530 A1 | 6/2014 | Chien et al. | |
| 2014/0203346 A1* | 7/2014 | Lee | H01L 29/7926 257/324 |
| 2014/0225181 A1 | 8/2014 | Makala et al. | |
| 2014/0353738 A1* | 12/2014 | Makala | H01L 27/11551 257/321 |
| 2015/0138862 A1* | 5/2015 | Park | H01L 27/11573 365/51 |
| 2016/0126248 A1* | 5/2016 | Rabkin | H01L 27/11524 257/321 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Masahide Kimura, "3D Cells Make Terabit NAND Flash Possible," Nikkei Electronics Asia, Sep. 17, 2009, 6pgs.
International Search Report & Written Opinion, PCT/US2011/042566, Jan. 17, 2012.
Invitation to Pay Additional Fees & Partial International Search Report, PCT/US2011/042566, Sep. 28, 2011.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.
Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.
Lim et al., "The Effect of CF4 Addition on Ru Etching with Inductively Coupled Plasma," Journal of the Korean Physical Society, vol. 42, Feb. 2003.
Lee et al., "Reactive Ion Etching Mechanism of $RuO_2$ Thin Films in Oxygen Plasma with the Addition of $CF_4$, $Cl_2$, and $N_2$," Abstract from 1998 Jpn. J. Appl. Phys. 37 2634.
Yunogami et al., "Anisotropic Etching of $RuO_2$ and Ru with High Aspect Ratio for Gigabit Dynamic Random Access Memory," Abstract from J. Vac. Sci. Technol. B 18, 1911 (2000).
Elam et al., "Nucleation and Growth During Tungsten Atomic Layer Deposition on $SiO_2$ Surfaces," Thin Solid Films, 386 (2001) pp. 41-52.
Park et al., "Thermal and Plasma Enhanced Atomic Layer Deposition Ruthenium and Electrical Characterization as a Metal Electrode," Microelectronic Engineering 85 (2008) pp. 39-44.
Thompson et al., "Stress Evolution During and After Deposition of Polycrystalline Thin Films," Department of Materials Science and Engineering, Massachusetts Institute of Technology.
R. Abermann, "Measurements of the Intrinsic Stress in Thin Metal Flims," Vacuum vol. 41, Nos. 4-6, pp. 1279-1282, 1990.
U.S. Appl. No. 14/133,979, filed Dec. 19, 2013, SanDisk Technologies Inc.

(56) References Cited

OTHER PUBLICATIONS

U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/314,370, filed Jun. 25, 2014, SanDisk Technologies Inc.
U.S. Appl. No. 14/464,480, filed Aug. 20, 2014, SanDisk Technologies Inc.
U.S. Appl. No. 14/553,124, filed Nov. 25, 2014, SanDisk Technologies Inc.
U.S. Appl. No. 14/553,207, filed Nov. 25, 2014, SanDisk Technologies Inc.
Invitation to Pay Additional Fees and Communication Relating to the Results of the Partial International Search for PCT/US2015/053829, dated Jan. 15, 2016, 8 pages.

* cited by examiner

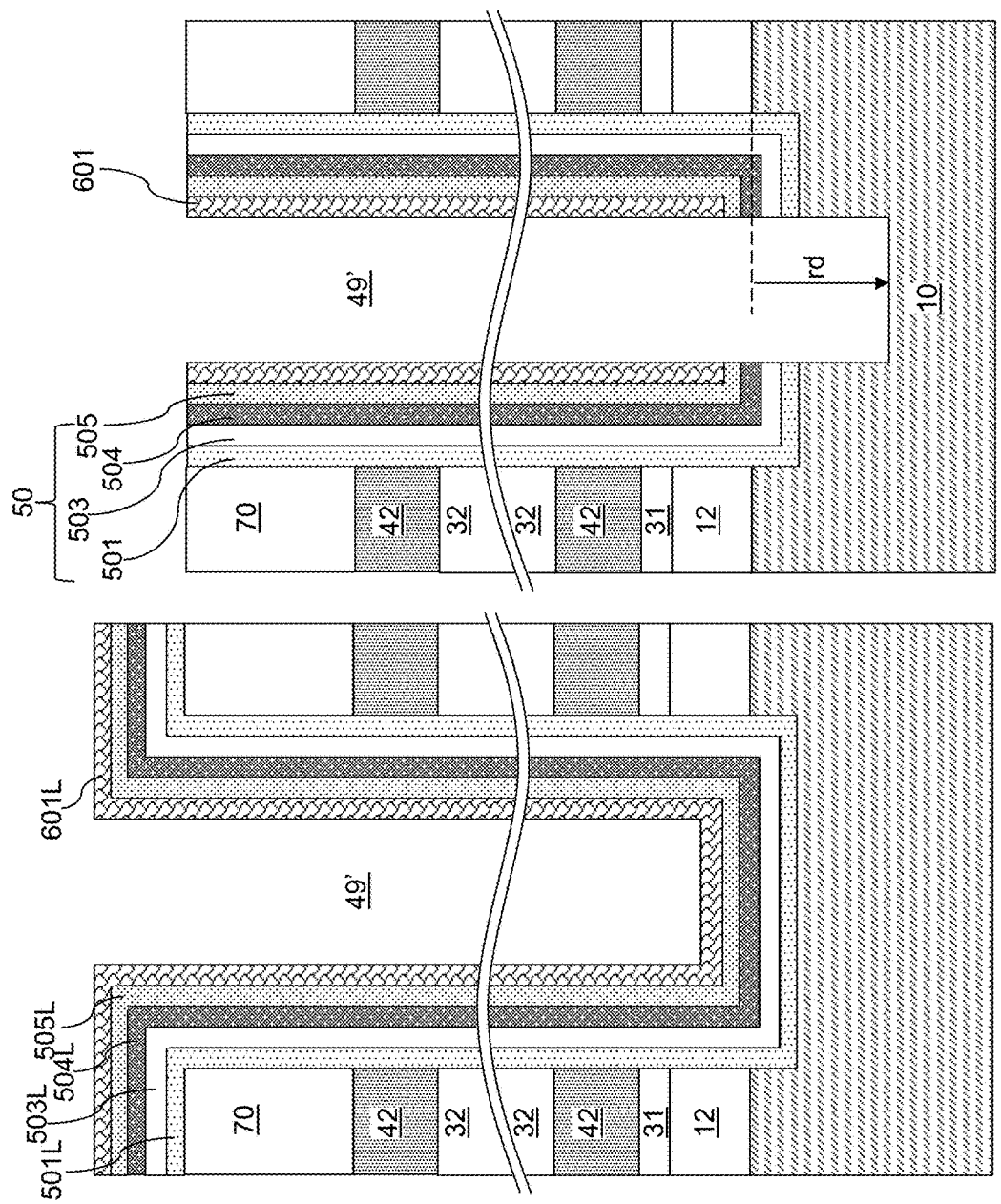

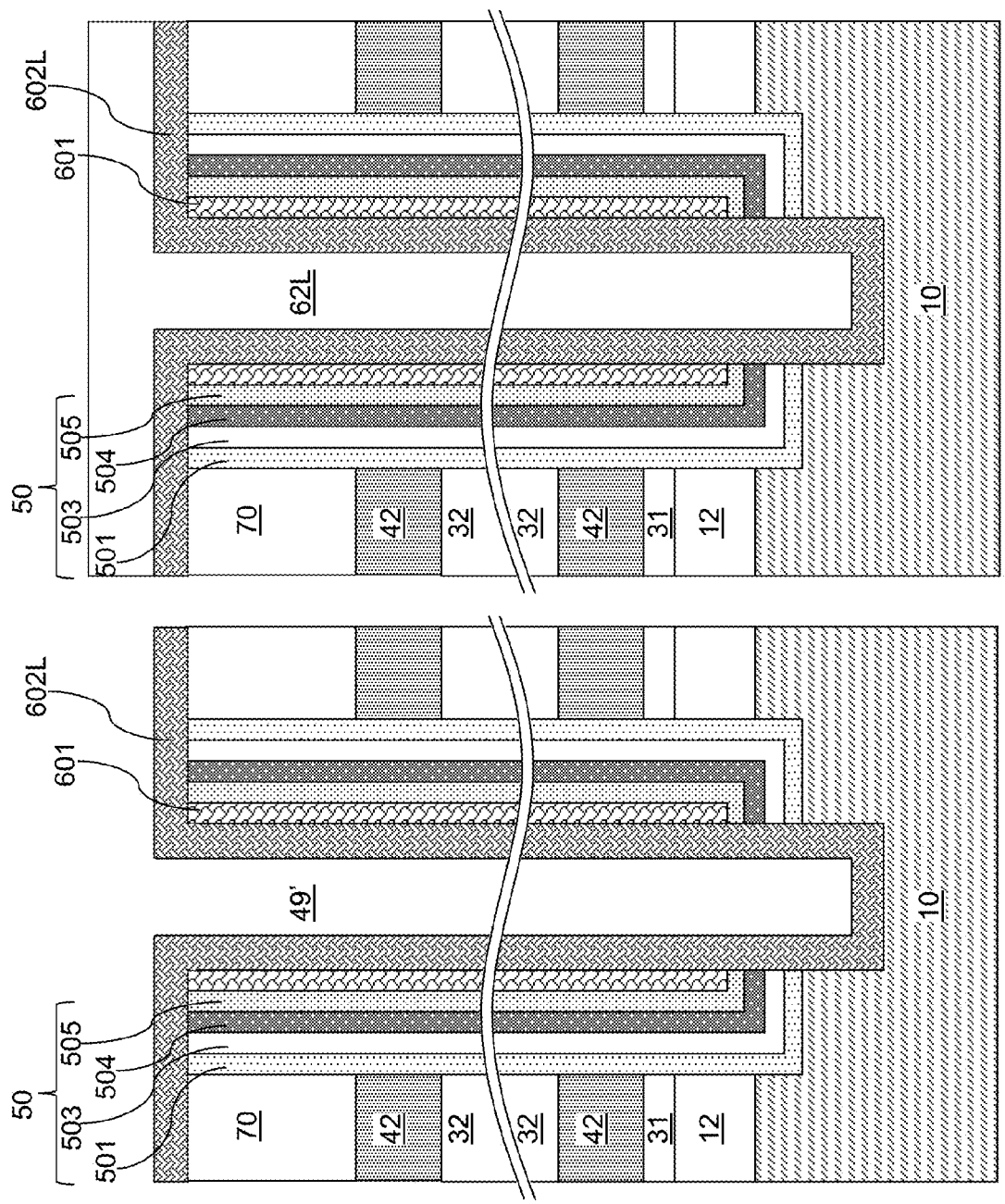

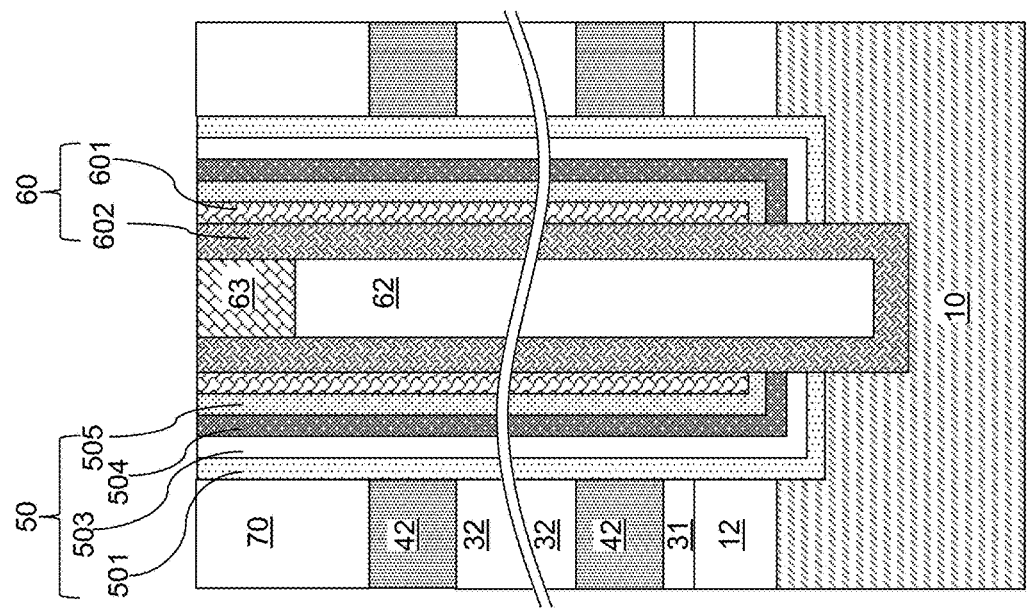
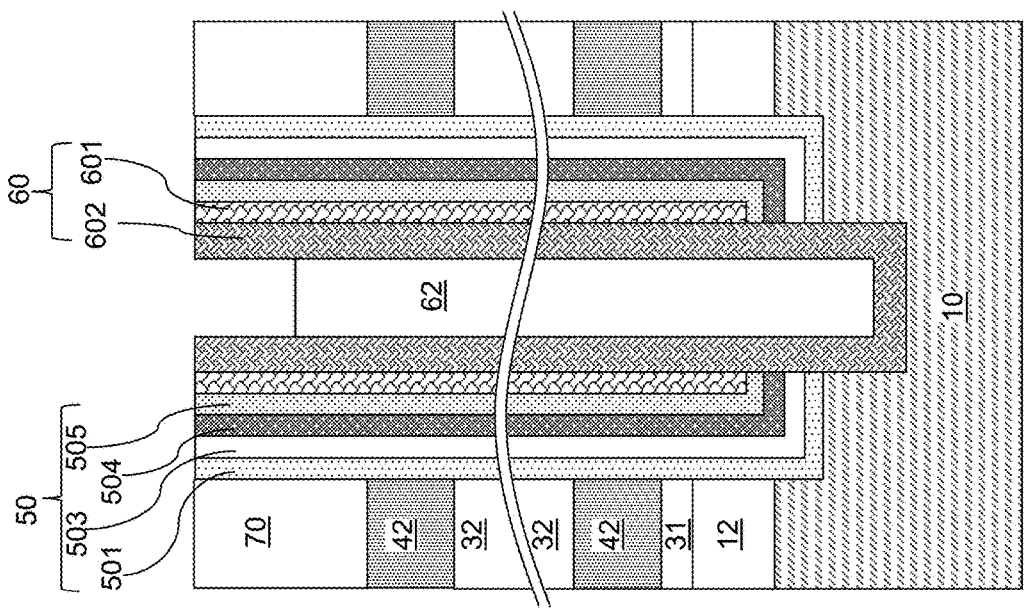

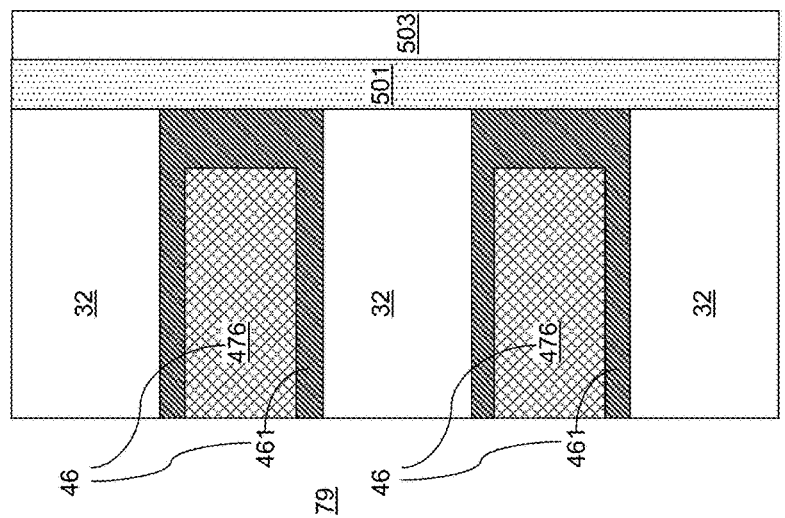
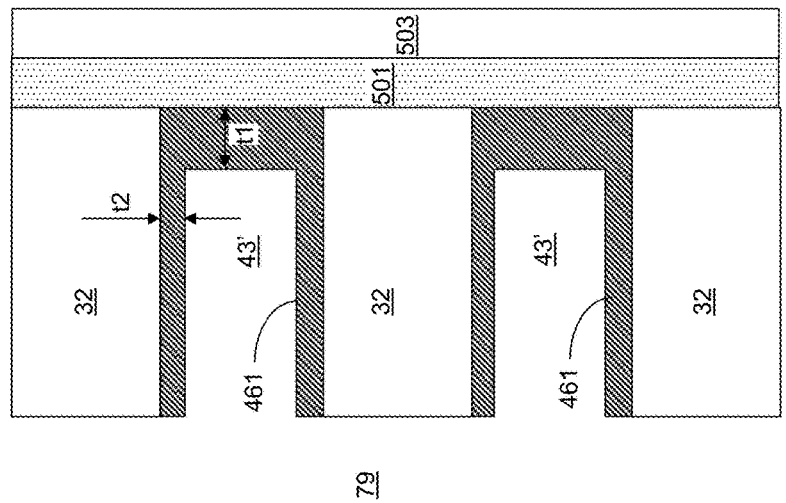

US 9,698,223 B2

MEMORY DEVICE CONTAINING STRESS-TUNABLE CONTROL GATE ELECTRODES

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprises a stack of alternating layers comprising insulator layers and electrically conductive layers and located over a top surface of a substrate, a semiconductor channel, wherein at least one end portion of the semiconductor channel extends substantially perpendicular to the top surface of the substrate, and a memory film located adjacent to the semiconductor channel. Each of the electrically conductive layers comprises a first conductive material portion including a tensile-stress-generating metallic material and a second conductive material portion including a compressive-stress-generating metallic material.

According to another aspect of the present disclosure, a three-dimensional memory device comprises a stack of alternating layers comprising insulator layers and electrically conductive layers and located over a top surface of a substrate, a semiconductor channel, wherein at least one end portion of the semiconductor channel extends substantially perpendicular to the top surface of the substrate, and a memory film located adjacent to the semiconductor channel. Each of the electrically conductive layers comprises an alloy of ruthenium and tungsten.

According to still another aspect of the present disclosure, a method of manufacturing a three-dimensional memory device comprises forming a stack of alternating layers comprising insulator layers and sacrificial material layers over a substrate, forming a memory opening through the stack, forming a memory film and a semiconductor channel in the memory opening, forming backside recesses around the memory film by removing the sacrificial material layers, and forming electrically conductive layers within the backside recesses. Each of the electrically conductive layers comprises a combination of a tensile-stress-generating metallic material and a compressive-stress-generating metallic material.

BRIEF DESCRIPTION OF THE DRAWINGS

FIGS. 2A-2F are sequential vertical cross-sectional views of a memory opening within the exemplary structure during various processing steps employed to form a memory stack structure according to an embodiment of the present disclosure.

FIGS. 6A-6D are sequential vertical cross-sectional views of a magnified region M in FIGS. 5A and 5B during formation of first exemplary electrically conductive layers according to a first embodiment of the present disclosure.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1:
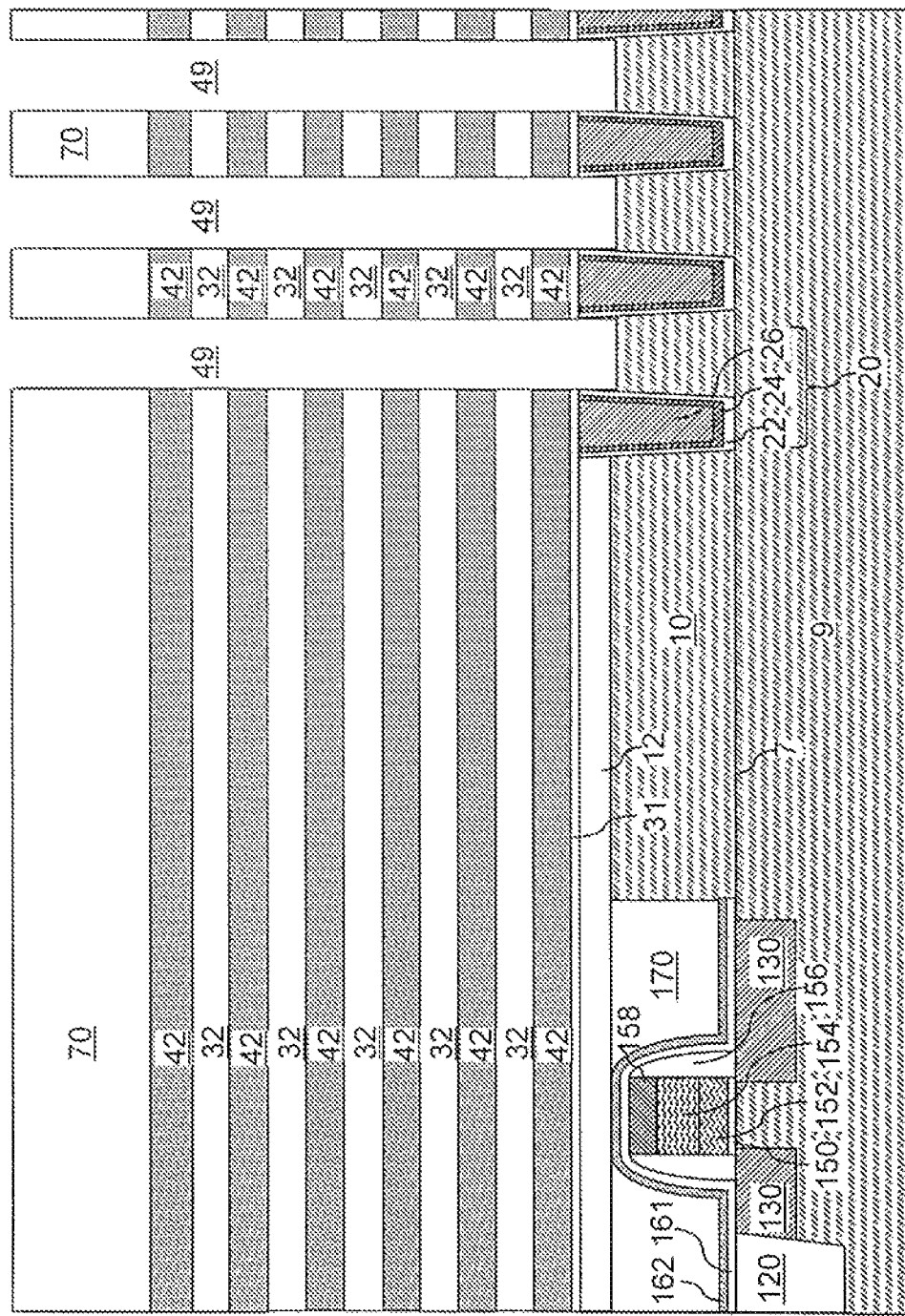
FIG. 1 is a vertical cross-sectional view of an exemplary structure after formation of a stack including an alternating plurality of material layers and memory openings extending through the stack according to an embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A lower select gate structure 20 can be formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure 20 can include a gate dielectric 22 and a gate electrode (24, 26). In one embodiment, each gate electrode (24, 26) can include an electrically conductive, (e.g., metallic) liner 24 and a conductive material portion 26. The metallic liner 24 can include, for example, TiN, TaN, WN, or a combination thereof. The conductive material portion 26 can include, for example, W, Al, Cu, or combinations thereof. At least one optional shallow trench isolation structure (not shown) and/or at least one deep trench isolation structure (not shown) may be employed to provide electrical isolation among various semiconductor devices that are present, or are to be subsequently formed, on the substrate.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2F illustrate sequential vertical cross-sectional views of a memory opening within the exemplary structure during formation of an exemplary memory stack structure according to a first embodiment of the present disclosure. Formation of the exemplary memory stack structure can be performed within each of the memory openings 49 in the exemplary structure illustrated in FIG. 1.

Referring to FIG. 2A, a memory opening 49 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

A series of layers including at least one blocking dielectric layer (501L, 503L), a memory material layer 504L, a tunneling dielectric layer 505L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

Subsequently, the memory material layer 504L, the tunneling dielectric layer 505L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 505L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505L can include a stack of a first silicon oxide layer, a silicon oxynitride layer, and a second silicon oxide layer, which is commonly known as an ONO stack. In one embodiment, the tunneling dielectric layer 505L can include a silicon oxide layer that is substantially free of carbon or a silicon oxynitride layer that is substantially free of carbon. The thickness of the tunneling dielectric layer 505L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 5051, 601L).

Referring to FIG. 2B, the optional first semiconductor channel layer 601L, the tunneling dielectric layer 505L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 505L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 505L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 505L, the memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 505L constitutes a tunneling dielectric 505. Each remaining portion of the memory material layer 504L is herein referred to as a charge storage element 504. In one embodiment, the charge storage element 504 can be a contiguous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the semiconductor material layer 10 can be physically exposed underneath the opening through the first semiconductor channel portion 601, the tunneling dielectric 505, the charge storage element 504, and the at least one blocking dielectric (501, 503). Optionally, the physically exposed semiconductor surface at the bottom of each cavity 49' can be vertically recessed so that the recessed semiconductor surface underneath the cavity 49' is vertically offset from the topmost surface of the semiconductor material layer 10 by a recess distance rd. A tunneling dielectric 505 is embedded within a charge storage element 504. The charge storage element 504 can comprise a charge trapping material or a floating gate material.

In one embodiment, the first semiconductor channel portion 601, the tunneling dielectric 505, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2C, a second semiconductor channel layer 602L can be deposited directly on the semiconductor surface of the semiconductor material layer 10 in the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2D, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2E, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 505 is embedded within a charge storage element 504, and laterally surrounds a portion of the semiconductor channel 60. Each adjoining set of a first blocking dielectric 501, a second blocking dielectric 503, a charge storage element 504, and a tunneling dielectric 505 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2F, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
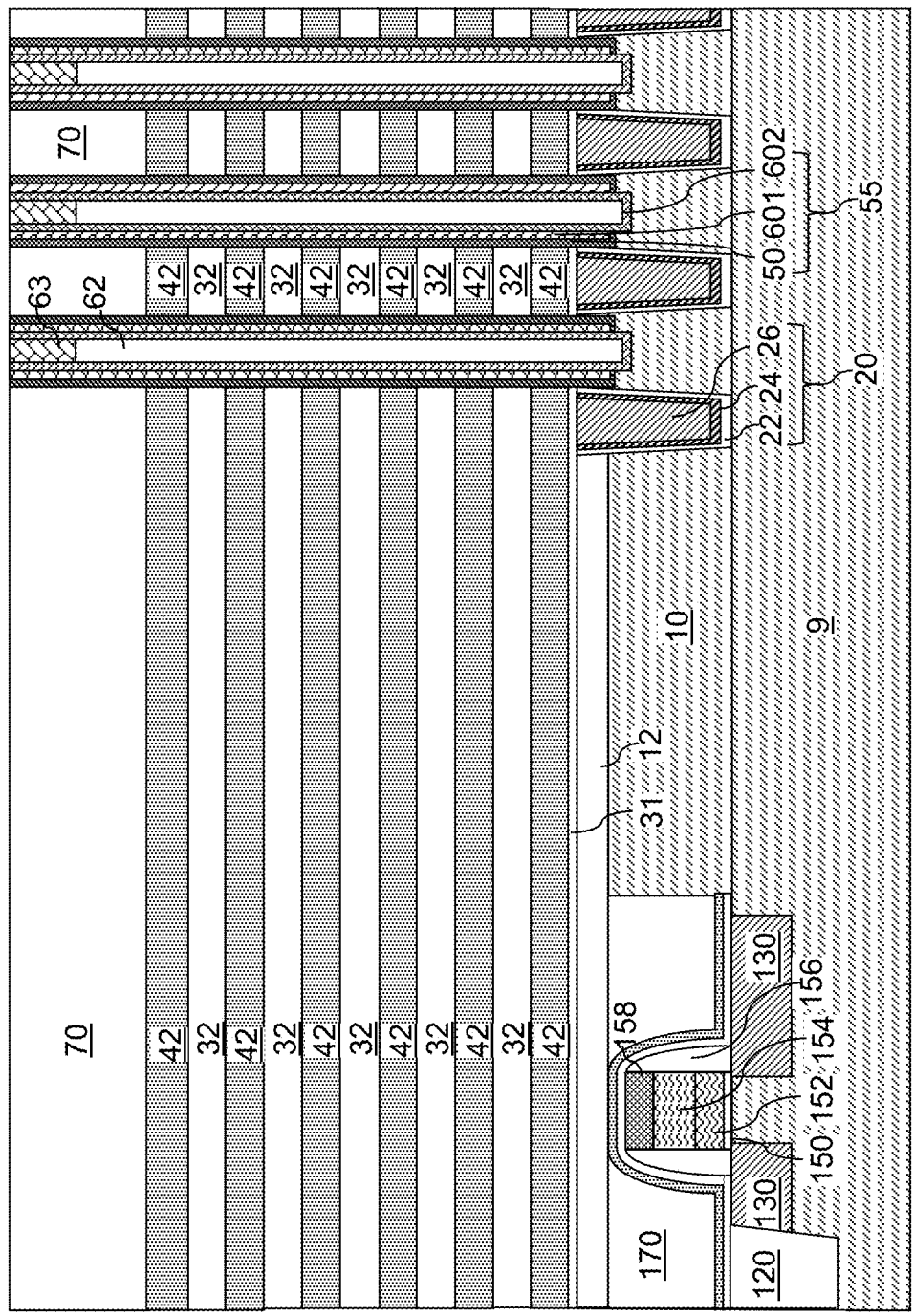
FIG. 3 is a vertical cross-sectional view of the exemplary structure after formation of memory stack structures according to an embodiment of the present disclosure.

The exemplary memory stack structure can be embedded into the exemplary structure illustrated in FIG. 1. FIG. 3 illustrates the exemplary structure that incorporates multiple instances of the exemplary memory stack structure of FIG. 2F. The exemplary structure includes a semiconductor device, which comprises a stack (32, 42) including an alternating plurality of material layers (e.g., the sacrificial material layers 42) and insulator layers 32 located over a semiconductor substrate (9, 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
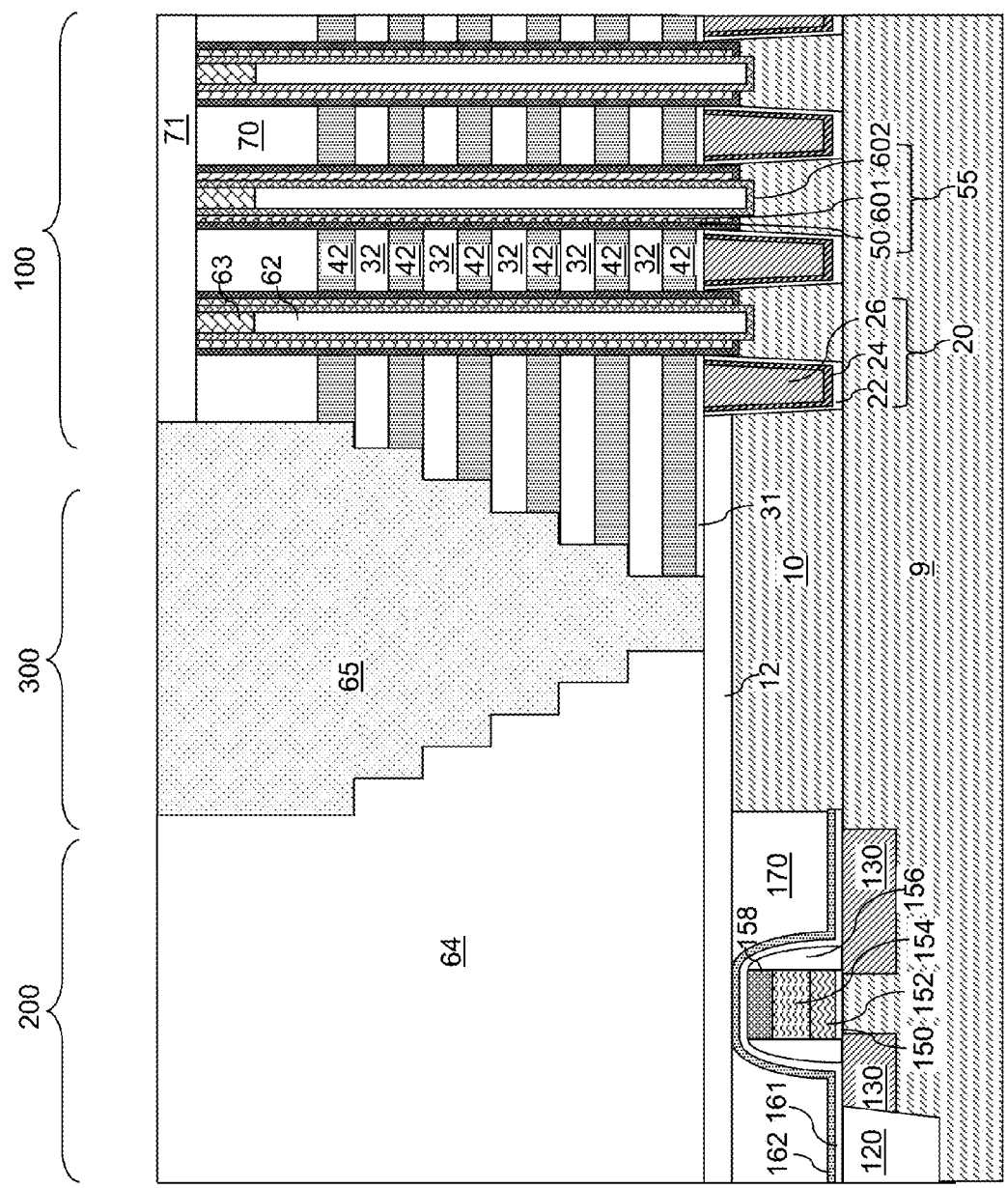
FIG. 4 is a vertical cross-sectional view of the exemplary structure after formation of a set of stepped surfaces and a retro-stepped dielectric material portion according to an embodiment of the present disclosure.

Referring to FIG. 4, at least one dielectric cap layer 71 can be optionally formed over the planarization dielectric layer 70. In one embodiment, the at least one dielectric cap layer 71 can include dielectric materials through which deuterium atoms can permeate. For example, the at least one dielectric cap layer can include silicon oxide and/or a dielectric metal oxide.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the at least one dielectric cap layer 71 by a planarization process such as chemical mechanical planarization and/or a recess etch. The top surfaces of the at least one dielectric cap layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the at least one dielectric cap layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
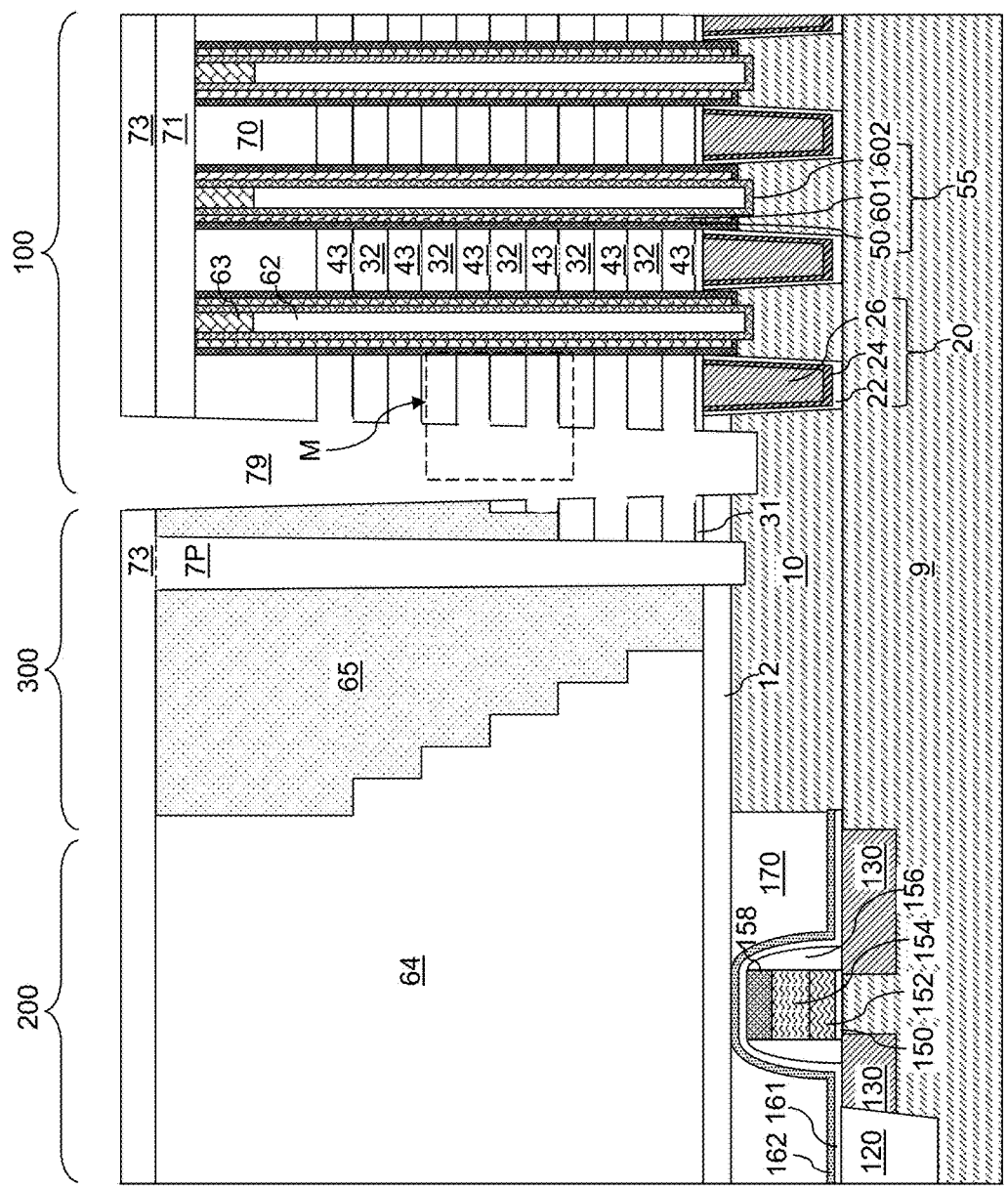
FIG. 5A is a vertical cross-sectional view of the exemplary structure after formation of a backside via cavity and backside recesses according to an embodiment of the present disclosure.
Figure 5B:
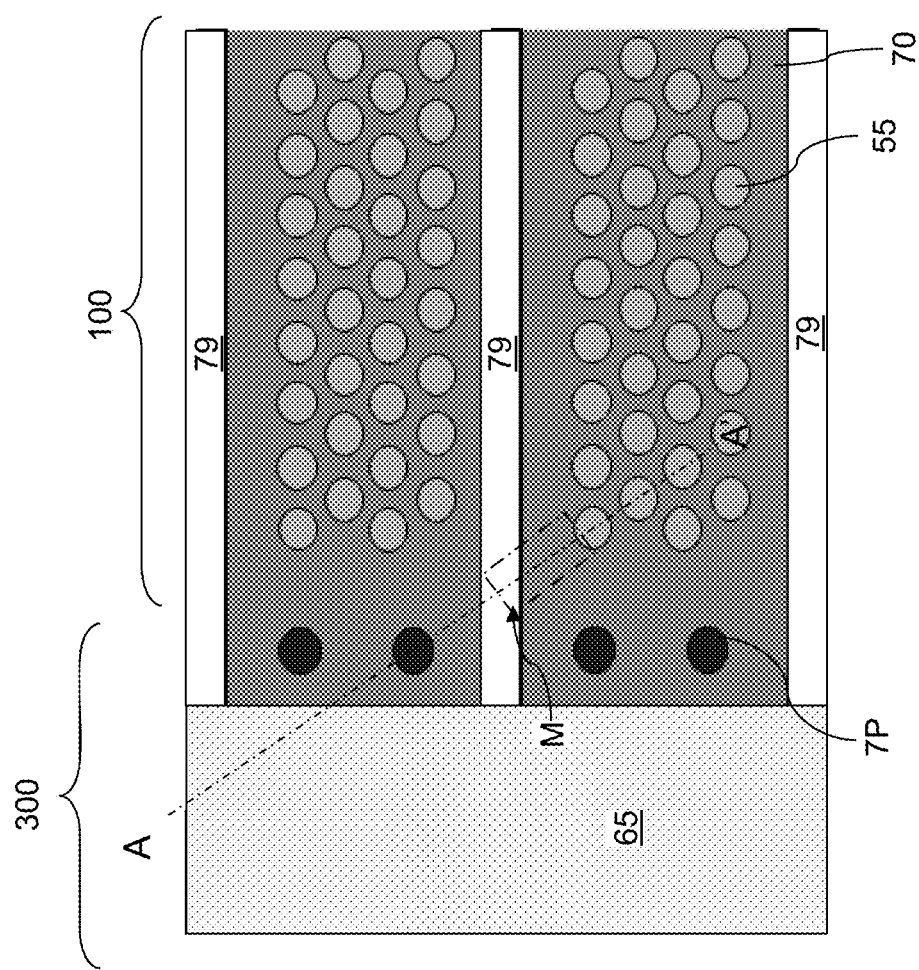
FIG. 5B is a see-through top-down view of the exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the alternating stack (32, 42). The plane A-A' in FIG. 5B corresponds to a plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42. In one embodiment, the at least one dielectric support pillar can include silicon oxide and/or a dielectric metal oxide such as aluminum oxide. In one embodiment, the portion of the dielectric material that is deposited over the at least one dielectric cap layer 71 concurrently with deposition of the at least one dielectric support pillar 7P can be present over the at least one dielectric cap layer 71 as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer 71 concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer 71 can be physically exposed.

A photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region (not shown) may be formed by implantation of dopant atoms into a portion of the semiconductor material layer 10 through the backside contact trench 79.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout. Optionally, a backside blocking dielectric layer can be formed in the backside recesses.

Metal layers, such as tungsten layers, employed in three-dimensional vertical NAND strings can apply a high level of compressive stress and warp substrates, which is disadvantageous for manufacturing semiconductor devices with uniformity.

Figure 6B:
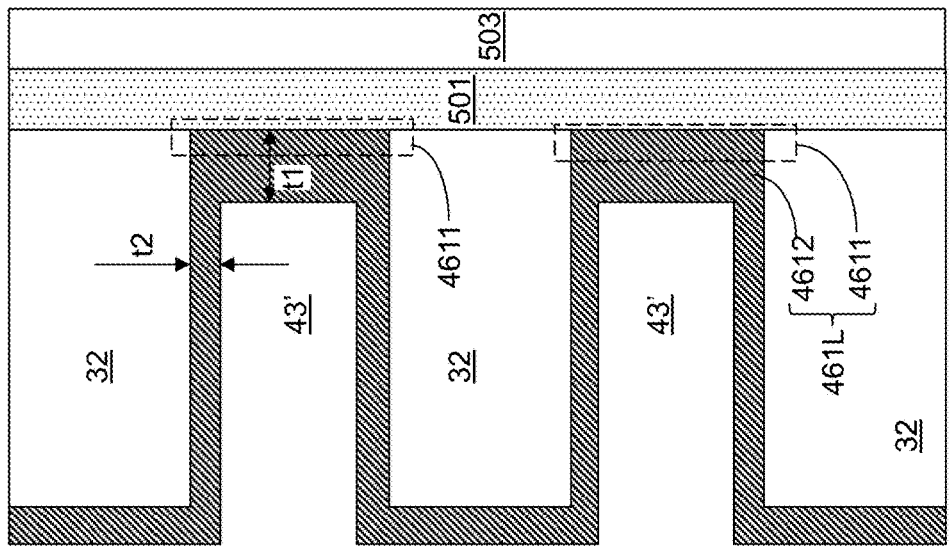
Figure 6A:
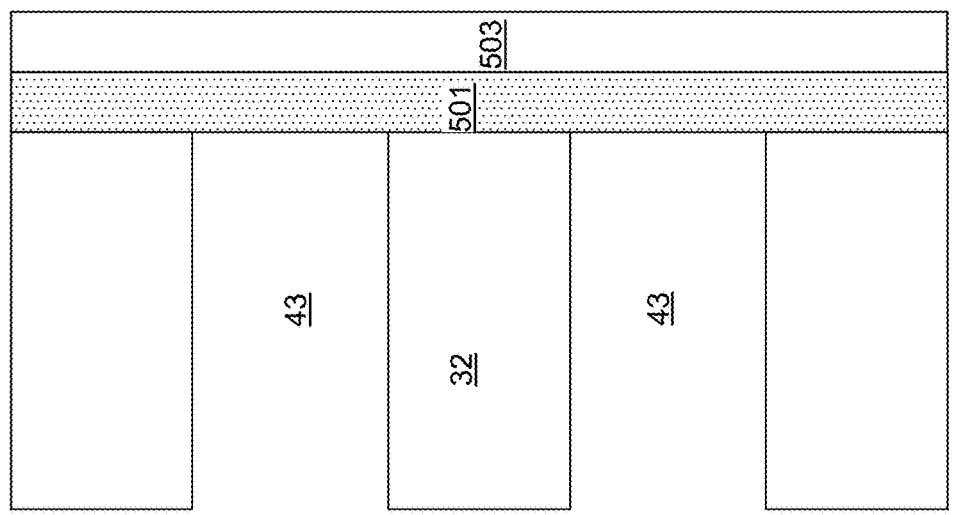

Referring to FIG. 6A, a vertical cross-sectional magnified view of a magnified region M in FIGS. 5A and 5B is illustrated, which includes a portion of the backside contact trench 79 and a plurality of backside recesses 43. In one embodiment, a sidewall surface of at least one blocking dielectric (501, 503) can be physically exposed at end portions of backside recesses 43. The sidewall surface of the at least one blocking dielectric (501, 503) is an outer sidewall surface of a memory film 50 illustrated in FIG. 2F. Alternatively, at least a portion of the blocking dielectric may be formed in the backside recesses 43 instead of or in addition to the at least one blocking dielectric (501, 503) formed in the memory openings 49.

Referring to FIG. 6B, a processing step for forming first exemplary electrically conductive layers is illustrated. A tensile-stress-generating metallic material is deposited on the physically exposed surfaces of the insulator layers 32 and the memory film 50 to form a tensile-stress-generating metallic material layer 461L. As used herein, a "tensile-stress-generating" element refers to an element that applies tensile stress to another element to which the element is attached. The material of a tensile-stress-generating element is under a compressive stress that is applied from the element to which the tensile-stress-generating element is attached. As used herein, a "compressive-stress-generating" element refers to an element that applies compressive stress to another element to which the element is attached. The material of a compressive-stress-generating element is under a tensile stress that is applied from the element to which the tensile-stress-generating element is attached.

In one embodiment, the tensile-stress-generating metallic material layer 461L can be a ruthenium layer, which can be deposited by atomic layer deposition ("ALD") on each physically exposed sidewall surface of the at least one blocking dielectric layer (501, 503), and each physically exposed surface of the insulator layers 32 that are present around the backside recesses 43 and around the backside contact trench 79. Deposition of the ruthenium layer can be performed by ALD by supplying a volatile ruthenium precursor, such as $RuO_4$ into a reaction chamber in which the exemplary structure is placed. One or more $RuO_2$ monolayers may be formed using atomic layer deposition. The one or more $RuO_2$ monolayers may be exposed to a reducing atmosphere to fully reduce the deposited one or more $RuO_2$ monolayers to one or more Ru monolayers. The $RuO_2$ deposition and Ru reducing steps (i.e., 1 atomic layer deposition cycle) may be repeated multiple times. A hydrogen based forming gas, such as 2%-5% (such as 4%) hydrogen and 95%-98% (such as 96%) nitrogen, may be supplied as the reducing atmosphere for the ruthenium. In one embodiment, the atomic layer deposition is performed by cycling, such as with more than 25 cycles (such as 30 cycles-55 cycles) to form a contiguous layer of Ru, i.e., a ruthenium layer, which applies tensile stress to the insulator layers 32 and the memory film 50.

ALD is surface sensitive deposition process, i.e., the film growth is strongly dependent on the substrate's surface characteristics. Without wishing to be bound by a particular theory, it is conjectured that the difference in nucleation is a function of the hydrophobicity of the surfaces, which results in different contact angles for different surfaces. That is, the more hydrophilic the surface, the lower contact angle.

Further, a lower contact angle results in a thinner film region. In one embodiment, the outer sidewall of the at least one blocking dielectric (501, 503) can be a more hydrophobic than the surfaces of the insulator layers 32. In this case, the thickness of the ruthenium layer (as embodied as the tensile-stress-generating metallic material layer 461L) can be greater at vertical portions of the ruthenium layer that contacts the at least one blocking dielectric (501, 503) (e.g., a first thickness t1) than at horizontal portions that contact horizontal surfaces of the insulator layers 32 (e.g., a second thickness t2, which is less than the first thickness t1).

Figure 6E:
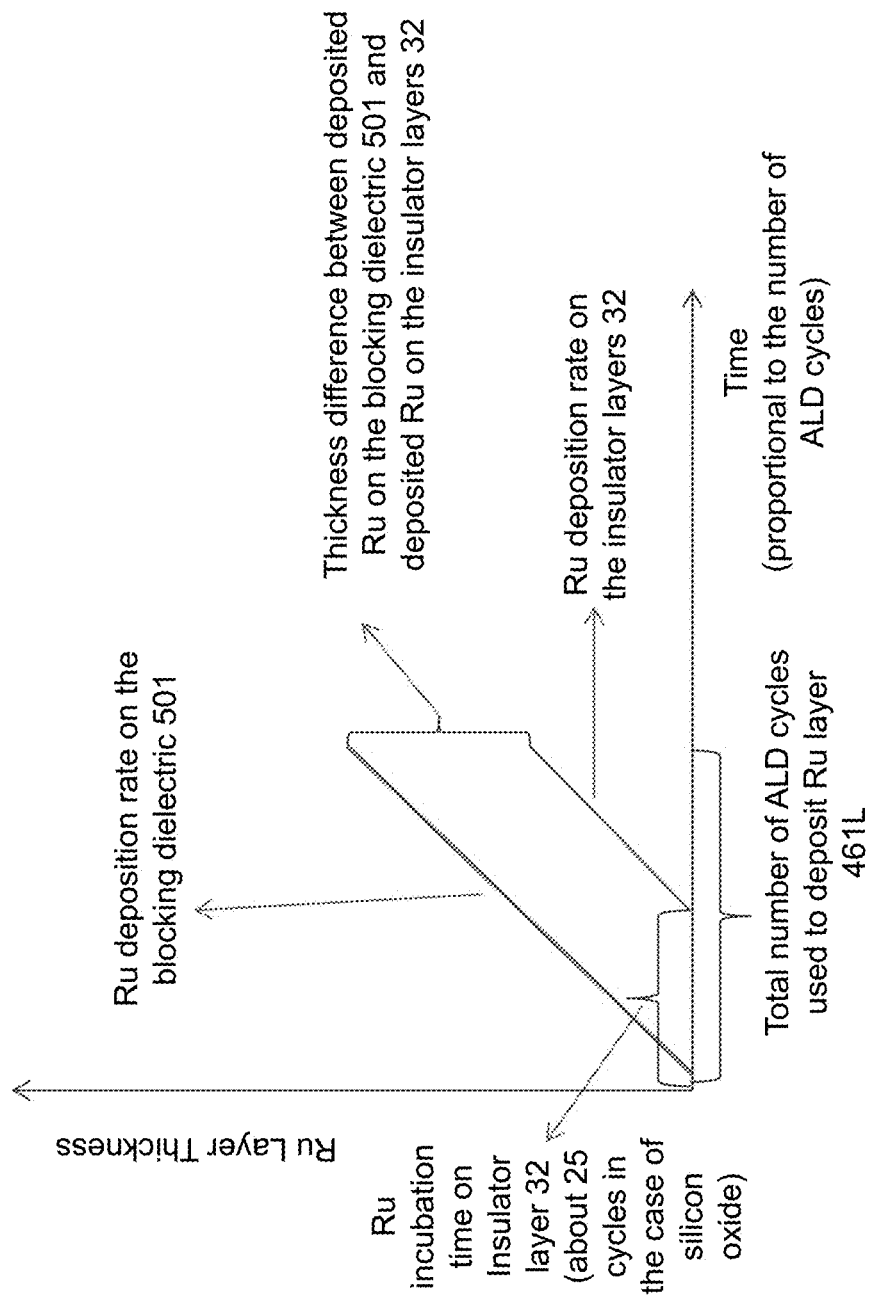
FIG. 6E is a schematic diagram illustrating the relationship between the deposited thickness of a ruthenium layer and ruthenium incubation time on an insulator surface.

The relationship between deposition rates of ruthenium on different surfaces and the incubation time for the respective surfaces is illustrated in FIG. 6E. In one embodiment, the incubation time at the surfaces of the blocking dielectric 501 (which can include a dielectric metal oxide) can be negligible, and the incubation time at the surfaces of the insulator layers 32 (which can include silicon oxide) can be significant.

Empirically, it has been observed that in case the insulator layers 32 comprise silicon oxide, less than 25 cycles of $RuO_2$ deposition steps and Ru reduction steps results in negligibly small deposition of ruthenium on the surfaces of the insulator layers 32, while continuous portions of ruthenium can be formed on more hydrophobic surfaces such as metal oxide or silicon nitride surfaces. In this case, the deposited ruthenium layer 461L can include first ruthenium sub-portions 4611, which are deposited on a sidewall of the memory film 50 as discrete material portions while not being deposited on surfaces of the insulator layers 32 during a first step of a ruthenium deposition process that correspond to up to about 25 cycles of the ALD process. The deposited ruthenium layer 461L can also include a second ruthenium sub-potion 4612, which is a contiguous layer that is deposited after nucleation of the ruthenium material on the surfaces of the insulator layer 32 after about the 25-th cycle of the ALD process, and corresponds to the entirety of the ruthenium layer less the first ruthenium sub-portions 4611 (that are deposited prior to about the 25-th ALD cycle). The second ruthenium sub-portion 4612 is deposited on the first ruthenium sub-portions and on the surfaces of the insulator layers 32 during a second step of the ruthenium deposition process that correspond to the cycles after about the 25-th cycle. More than 25 cycles of $RuO_2$ deposition steps and Ru reduction steps results in a contiguous layer ruthenium on the surfaces of the insulator layers 32 and the memory film 50. The deposited ruthenium material forms the ruthenium layer, which is a continuous material portion extending through the entire vertical extent of the backside contact trench 79. Ruthenium is deposited directly on a bottom surface of an overlying insulator layer 32 above each respective backside recess 43, and on a top surface of an underlying insulator layer 32 below each respective backside recess 43. A recess cavity 43' is present in each volume of a backside recess 43 that is not occupied by the ruthenium layer (as embodied as a tensile-stress-generating metallic material layer 461L).

In one embodiment, the outer surface of the first blocking dielectric layer 501 can be a material less hydrophilic than silicon oxide, such as silicon nitride, and the insulator layers 32 can include silicon oxide. In this case, the first thickness t1 of the vertical portions of the ruthenium layer in contact with the outer surface of the first blocking dielectric layer 501 can be in a range from 3 nm to 12 nm, and the second thickness t2 of the portions of the ruthenium layer in contact with surfaces of the insulator layer 32 can be in a range from 1 nm to 7 nm. The ruthenium layer can consist essentially of ruthenium. The impurity contents in the ruthenium layer can be determined by the impurity level of the reactant gas, i.e., in the $RuO_4$ gas, and can be less than 10 parts per million (p.p.m.) or less than 1 p.p.m. In one embodiment, each first conductor material portion 461 can include a vertical portion contacting the memory film 50 and a pair of horizontal portions laterally extending from the vertical portion and vertically spaced from each other. The pair of horizontal portions can have a uniform thickness that is less than a thickness of the vertical portion.

Referring to FIG. 6C, an anisotropic etch is performed to remove vertical portions of the tensile-stress-generating metallic material layer 461L from the sidewalls of the insulator layers 32 and a horizontal bottom surface of the backside contact trench 79. In one embodiment, the backside contact trench 79 can be formed with a finite taper angle, which can be in a range from 0.2 degrees to 3 degrees. A taper, if present in the sidewalls of the backside contact trench 79, can be advantageously employed to facilitate the removal of the vertical portions of the tensile-stress-generating metallic material layer 461L from the sidewalls of the insulator layers 32.

The sidewalls of the insulator layers 32 are physically exposed after the anisotropic etch at the periphery of the backside contact trench 79. Each remaining discrete portion of the tensile-stress-generating metallic material layer 461L within a backside recess constitutes a first conductive material portion 461. In one embodiment, each first conductive material portion 461 can include a vertical portion having the first thickness t1, and horizontal portions having the second thickness t2, which is less than the first thickness t1. In one embodiment, each first conductive material portion 461 can be a ruthenium portion consisting essentially of ruthenium. Each first conductive material portion 461 is deposited within one level of the stack, and does not adjoin other first conductive material portions 461 located at any other level of the stack after formation of the first conductive material portions 461. Each first conductive material portion 461 is deposited within one level of the stack, and does not adjoin other first conductive material portions 461 located at any other level of the stack after formation of the ruthenium portions 461.

Referring to FIG. 6D, a compressive-stress-generating metallic material is deposited on the physically exposed surfaces of the tensile-stress-generating metallic material layer 461L to form second conductive material portions 476. The compressive-stress-generating metallic material of the second conductive material portions 476 applies compressive stress to the structure to which the second conductive material portions 476 are attached, i.e., to the memory film 50, the insulator layers 32, and the tensile-stress-generating metallic material layer 461L which transfer it to the substrate 9 causing it to warp. In one embodiment, the compressive-stress-generating metallic material can be deposited by a conformal deposition method such as chemical vapor deposition or atomic layer deposition. Exemplary metallic materials that generate compressive stress upon deposition include, but are not limited to, tungsten, chromium, and titanium.

In one embodiment, the compressive-stress-generating metallic material can be deposited on each first conductive material portion 461 by a selective deposition process, which can be a chemical vapor deposition process. The conductive material can be selected such that deposition of the conductive material does not occur directly on the dielectric material of the insulator layers 32, but proceeds from the surfaces of the first conductive material portions 461 employing the first conductive material portions 461 as a seeding layer. Thus, the conductive material grows only from surfaces of the first conductive material portions 461 from within each backside recess to form the second conductive material portions 476. The growth of each second conductive material portion 476 proceeds from the physically exposed surfaces of the first conductive material portions 461, and does not proceed from surfaces of the insulator layers 32 during formation of the second conductive material portions 476.

Each second conductive material portion 476 includes the compressive-stress-generating metallic material, and is spaced from an overlying insulator layer 32 and an underlying insulator layer 32 by the thickness of a horizontal sub-portion of a first conductive material portion 461. The duration of the deposition process that deposits the compressive-stress-generating metallic material of the second conductive material portions 476 can be selected so that each second conductive material portion 476 fills the backside cavity 43' and extends into a portion of the backside contact cavity 79. Optionally, an anisotropic etch can be performed to remove sub-portions of the second conductive material portions 476 that protrude into the backside contact trench 79. In this case, a sidewall of each second conductive material portion 476 can be substantially vertically coincident with sidewalls of the backside contact trench 79. Each second conductive material portion 476 is deposited within one level of the stack, and does not adjoin other second conductive material portions 476 located at any other level of the stack after formation of the second conductive material portions 461.

In one embodiment, the compressive-stress-generating metallic material can be tungsten that is deposited by reduction of $WF_6$ in hydrogen. In this case, the deposited compressive-stress-generating metallic material can consist essentially of tungsten. Particularly, the deposited compressive-stress-generating tungsten material can be free of silicon or boron, which is necessarily present in a tungsten seed layer formed by reduction of $WF_6$ with silane, dichlorosilane, or diborane. While reduction of $WF_6$ with silane, dichlorosilane, or diborane provides a conformally nucleated film that is deposited on all types of surfaces, the resulting film includes not only tungsten, but also includes silicon or boron in a significant quantity that exceeds, for example, 1 p.p.m., and in some cases 10 p.p.m. or more. Further, the tungsten-including alloy derived from reduction of $WF_6$ with silane, dichlorosilane, or diborane is amorphous, and has a resistivity that is about ten times higher than tungsten film derived from reduction of $WF_6$ with hydrogen.

In contrast, tungsten derived by reduction of $WF_6$ in hydrogen is deposited only on metallic surfaces, and does not grow from dielectric surfaces such as the surfaces of the insulator layers 32, which can be, for example, silicon oxide surfaces. Further, tungsten that is deposited by reduction of $WF_6$ in hydrogen is polycrystalline, thereby providing a lower resistivity than a tungsten alloy layer formed by reduction of $WF_6$ with silane, dichlorosilane, or diborane and including silicon or boron. Thus, deposition of tungsten by reduction of $WF_6$ in hydrogen provides a high purity tungsten portion consisting essentially of tungsten and providing a low bulk resistivity. In one embodiment, the entirety of each second conductive material portion 476 can comprise polycrystalline tungsten having a same average grain size throughout, and applying a compressive stress to surrounding structural elements. Each tungsten portion can be formed by selective growth of tungsten from a first conductive material portion 461, and not grow from surfaces of the insulator layers 32. In one embodiment, growth of tungsten can proceed from a preexisting portion of tungsten or one of the first conductive material portions 461, and does not proceed from surfaces of the insulator layers 32 during formation of the tungsten portions.

In one embodiment, each first conductive material portion 461 comprises ruthenium, and is formed within a respective backside recess, and each second conductive material portion 476 comprises a material other than ruthenium, and is formed on a surface of a first conductive material portion 461. Each second conductive material portion 476 is formed directly on a sidewall of a first conductive material portion 461. In one embodiment, each first conductive material portion 461 comprises a ruthenium portion and each second conductive material portion 476 a tungsten portion consisting essentially of tungsten.

Each adjoining pair of a first conductive material portion 461 and a second conductive material portion 476 collectively constitutes an electrically conductive layer 46. Each first conductive material portion 461 includes a tensile-stress-generating metallic material, and each second conductive material portion 476 includes a compressive-stress-generating metallic material. In one embodiment, each first conductive material portion 461 comprises a ruthenium portion and each second conductive material portion 476 a compressive-stress-generating metallic material.

Each first conductive material portion 461 applies a compress stress to surrounding structures, and each second conductive material portion 476 applies a compressive stress to surrounding structures. Thus, the compressive stress generated by the second conductive material portions 476 and the tensile stress generated by the first conductive material portions 461 at least partially cancel each other. Thus, the magnitude of the overall stress generated by the combination of a first conductive material portion 461 and a second conductive material portion 476 can be between the magnitude of the overall stress generated by a structure including the same volume as the combination and consisting of the tensile-stress-generating metallic material of the first conductive material portions 461, or consisting of the compressive-stress-generating metallic material of the second conductive material portions 476.

Figure 7A:
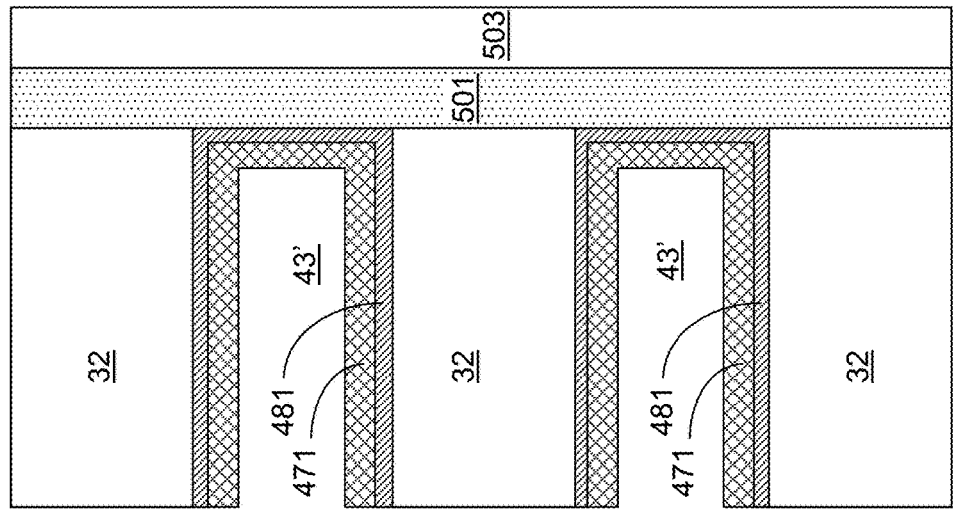
FIGS. 7A-7C are sequential vertical cross-sectional views of a magnified region M in FIGS. 5A and 5B during formation of second exemplary electrically conductive layers according to a second embodiment of the present disclosure.

A set of alternative processing steps may be performed in lieu of the processing steps of FIGS. 6B-6D, in which the location of the first and the second conductive material portions is reversed compared to the location shown in FIG. 6C. Referring to FIG. 7A, a contiguous metallic material layer 481L can be deposited on each physically exposed sidewall surface of the at least one blocking dielectric layer (501, 503), and each physically exposed surface of the insulator layers 32 that are present around the backside recesses 43 and around the backside contact trench 79 on the structure illustrated in FIG. 6A. The contiguous metallic material layer 481L can be any suitable diffusion barrier layer, such as a metallic nitride layer such as TiN, TaN, WN, an alloy thereof, or a stack thereof. The contiguous metallic material layer 481L can be deposited on the surfaces of the backside contact trench 79 and on the surfaces of the backside recesses 43 that laterally protrude from the backside contact trench 79. The contiguous metallic material layer 481L can be deposited by a conformal deposition process such as by chemical vapor deposition or atomic layer deposition. The contiguous metallic material layer 481L can nucleate uniformly on all dielectric surfaces, and can have the same thickness throughout. The contiguous metallic material layer 481L can be formed as a contiguous material layer that extends through the entirety of the backside contact trench 79. The thickness of the contiguous metallic material layer 481L can be in a range from 2 nm to 10 nm, although lesser and greater thicknesses can also be employed.

Subsequently, a compressive-stress-generating metallic material is deposited on the physically exposed surfaces of the contiguous metallic material layer 481L to form a compressive-stress-generating metallic material layer 471L. The compressive-stress-generating metallic material applies compressive stress to the structure to which the compressive-stress-generating metallic material layer 471L is attached, i.e., to the memory film 50, the insulator layers 32, and the contiguous metallic material layer 481L. In one embodiment, the compressive-stress-generating metallic material can be deposited by a conformal deposition method such as chemical vapor deposition or atomic layer deposition. Exemplary metallic materials that generate compressive stress upon deposition include, but are not limited to, tungsten, chromium, and titanium.

In one embodiment, the compressive-stress-generating metallic material can be deposited on the entire physically exposed surfaces of the contiguous metallic material layer 481L employing the contiguous metallic material layer 481L as a seeding layer. The compressive-stress-generating metallic material layer 471L includes the compressive-stress-generating metallic material, and is spaced from an overlying insulator layer 32 and an underlying insulator layer 32 by the thickness of the contiguous metallic material layer 481L. The duration of the deposition process that deposits the compressive-stress-generating metallic material of the compressive-stress-generating metallic material layer 471L can be selected so that the deposited compressive-stress-generating metallic material does not fill an entirety of each backside recess, but forms a backside cavity 43' within each backside recess.

In one embodiment, the compressive-stress-generating metallic material can include a tungsten-containing layer that is deposited by reduction of $WF_6$ in silane, dichlorosilane, or diborane. The tungsten-containing layer can be formed by flowing $WF_6$ concurrently with at least one silane, dichlorosilane, and diborane. The tungsten-containing layer contains tungsten predominantly, and a significant level of silicon or boron at a concentration greater than 1 p.p.m. Thus, the tungsten-containing layer can be a tungsten alloy layer in which atomic concentration of tungsten is at least 95%, and can be greater than 99%. The tungsten-containing layer can be amorphous. In one embodiment, the thickness of the tungsten-containing layer can be selected as a minimal thickness that enables the tungsten-containing layer as a seeding layer for further deposition of tungsten by reduction of $WF_6$ in hydrogen. In one embodiment, the thickness of the tungsten-containing layer formed by reduction of $WF_6$ in silane, dichlorosilane, or diborane can be in a range from 1 nm to 5 nm, although lesser and greater thicknesses can also be employed.

In another embodiment, the compressive-stress-generating metallic material layer 471L can include a tungsten-containing seed layer that is deposited by reduction of $WF_6$ in silane, dichlorosilane, or diborane and a tungsten gate layer including tungsten that is deposited by reduction of $WF_6$ in hydrogen. In this case, the compressive-stress-generating metallic material deposited by reduction of $WF_6$ in hydrogen can consist essentially of tungsten. Particularly, the deposited compressive-stress-generating tungsten material can be free of silicon or boron, which is present in a tungsten seed layer formed by reduction of $WF_6$ with silane, dichlorosilane, or diborane. Tungsten that is deposited by reduction of $WF_6$ in hydrogen is polycrystalline, thereby providing a lower resistivity than a tungsten alloy layer formed by reduction of $WF_6$ with silane, dichlorosilane, or diborane and including silicon or boron. Thus, deposition of tungsten by reduction of $WF_6$ in hydrogen provides a high purity tungsten portion consisting essentially of tungsten and providing a low bulk resistivity.

In one embodiment, the compressive-stress-generating metallic material layer 471L can consist of an amorphous tungsten alloy layer composed predominantly of tungsten and containing silicon or boron in a concentration above unavoidable trace impurity level. In this case, the thickness of the compressive-stress-generating metallic material layer 471L can be in a range from 1 nm to 5 nm. In another embodiment, the compressive-stress-generating metallic material layer 471L can comprise a stack of an amorphous tungsten alloy sublayer composed predominantly of tungsten and containing some silicon or boron, and a polycrystalline substantially pure tungsten sublayer having a same average grain size throughout. In this case, the thickness of the compressive-stress-generating metallic material layer 471L can be in a range from 3 nm to 20 nm. The compressive-stress-generating metallic material layer 471L applies a compressive stress to surrounding structural elements.

Figure 7B:
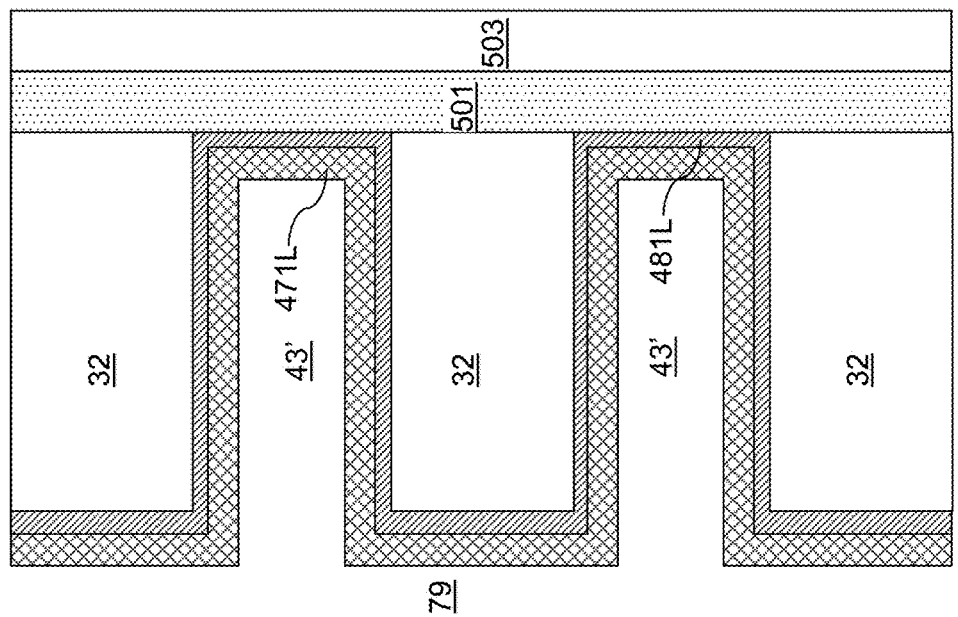

Referring to FIG. 7B, an anisotropic etch is performed to remove vertical portions of the contiguous metallic material layer 481L and the compressive-stress-generating metallic material layer 471L from the sidewalls of the insulator layers 32 and a horizontal bottom surface of the backside contact trench 79. In one embodiment, the backside contact trench 79 can be formed with a finite taper angle, which can be in a range from 0.2 degrees to 3 degrees. A taper, if present in the sidewalls of the backside contact trench 79, can be advantageously employed to facilitate the removal of the vertical portions of the contiguous metallic material layer 481L and the compressive-stress-generating metallic material layer 471L from the sidewalls of the insulator layers 32.

The sidewalls of the insulator layers 32 are physically exposed after the anisotropic etch at the periphery of the backside contact trench 79. Each remaining discrete portion of the contiguous metallic material layer 481L within a backside recess constitutes a metallic liner (e.g., diffusion barrier) 481. Each remaining portion of the compressive-stress-generating metallic material layer 471L within a backside recess constitutes a second conductive material portion 471 including a compressive-stress-generating metallic material. Each metallic liner 481 can be formed on a bottom surface of an overlying insulator layer 32 above each respective backside recess 43', on a top surface of an underlying insulator layer 32 below each respective backside recess 43', and on an outer sidewall of the memory film 50. Each metallic liner 481 can include a vertical portion contacting the memory film 50 and a pair of horizontal portions laterally extending from the vertical portion and vertically spaced from each other. In one embodiment, the entirety of each metallic liner 481 can have the same thickness throughout. Each second conductive material portion 471 can be vertically spaced from an insulator layer 32 by a horizontal portion of a metallic liner 481. Each second conductive material portion 471 can include a vertical portion contacting a vertical portion of a metallic liner 481 and a pair of horizontal portions laterally extending from the vertical portion and vertically spaced from each other.

In one embodiment, the entirety of each second conductive material portion 471 can have the same thickness throughout. In one embodiment, each of the second conductive material portions 471 can be a portion of a compressive-stress-generating metallic material selected from tungsten, chromium, titanium, and an alloy thereof. In one embodiment, each of the second conductive material portions 471 can be a tungsten portion.

Figure 7C:
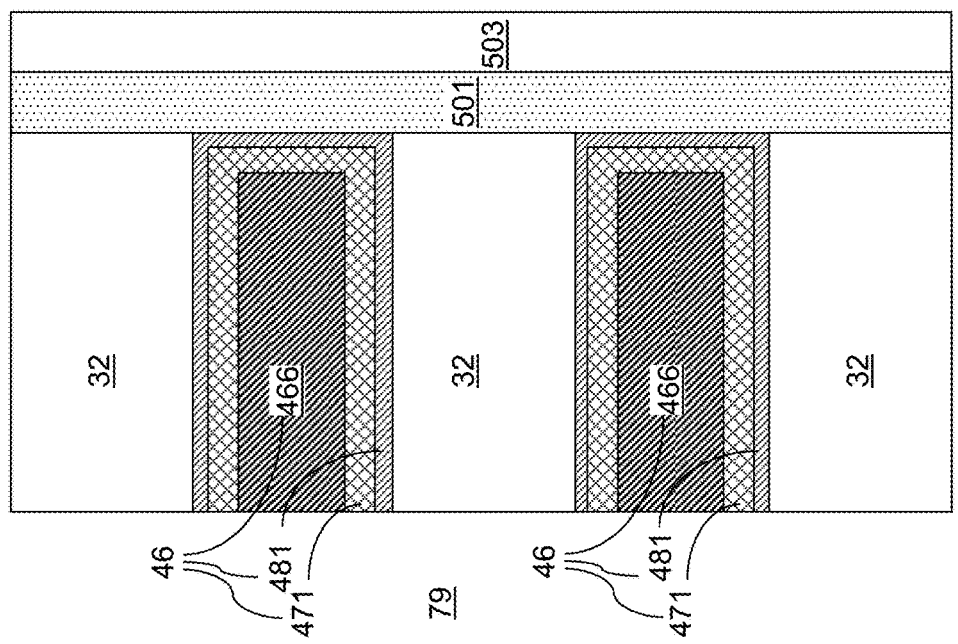

Referring to FIG. 7C, a tensile-stress-generating metallic material is deposited on the physically exposed surfaces of the second conductive material portion 471 to form first conductive material portions 466. The tensile-stress-generating metallic material applies tensile stress to the structure to which the first conductive material portions 466 are attached, i.e., to the memory film 50, the insulator layers 32, and the second conductive material portions 471, which transfer the stress to the substrate 9. In one embodiment, the tensile-stress-generating metallic material can be deposited by a conformal deposition method such as chemical vapor deposition or atomic layer deposition. Exemplary metallic materials that generate compressive stress upon deposition include, but are not limited to, ruthenium, gold, silver, copper, and alloys thereof.

In one embodiment, the tensile-stress-generating metallic material can be deposited on each second conductive material portion 471 by a selective deposition process, which can be a chemical vapor deposition process or an ALD process. Alternatively, the tensile-stress-generating metallic material may be deposited non-selectively on the surfaces of the second conductive material portions 471. In other words, the compressive-stress-generating metallic material may, or may not, grow from the surfaces of the insulator layers 32, while growing from the physically exposed surfaces of the second conductive material portions 471.

Each first conductive material portion 466 includes the tensile-stress-generating metallic material, and is spaced from an overlying insulator layer 32 and an underlying insulator layer 32 by the sum of the thickness of the metallic liner 481 and the thickness of a second conductive material portion 471. The duration of the deposition process that deposits the tensile-stress-generating metallic material of the first conductive material portions 466 can be selected so that each first conductive material portion 466 fills the backside cavity 43' and extends into a portion of the backside contact cavity 79. Optionally, an anisotropic etch can be performed to remove sub-portions of the first conductive material portions 466 that protrude into the backside contact trench 79. In this case, a sidewall of each first conductive material portion 466 can be substantially vertically coincident with sidewalls of the backside contact trench 79. Each first conductive material portion 466 is deposited within one level of the stack, and does not adjoin other first conductive material portions 466 located at any other level of the stack after formation of the first conductive material portions 466.

In one embodiment, the tensile-stress-generating metallic material can be ruthenium. The same ALD process can be employed as described for the step of FIG. 6B. Ruthenium can be deposited on each physically exposed sidewall surface of the second conductive material portions 471, and may, may not, be deposited physically exposed surface of the insulator layers 32. If the insulator layers 32 include a dielectric material having a hydrophilic surface and if the number of cycles in the ALD process for depositing ruthenium is less than about 25 cycles, ruthenium can be deposited on the surfaces of the second conductive material portions 471 and not be deposited on the surfaces of the insulator layers 32. If the insulator layers 32 include a dielectric material having a hydrophobic surface or if the number of cycles in the ALD process for depositing ruthenium is more than about 25 cycles, ruthenium can be deposited on the surfaces of the second conductive material portions 471 and on the surfaces of the insulator layers 32.

Each portion of ruthenium deposited on a second metallic material portion 471 constitutes a first metallic material portion 466 including ruthenium. Each first metallic material portion 466 can consist essentially of ruthenium. If the material of the first metallic material portions 466 is deposited within the volume of the backside contact trench 79, the material of the first metallic material portions 466 can be removed from inside the volume of the backside contact trench 79 by performing an anisotropic etch. In one embodiment, the backside contact trench 79 can be formed with a finite taper angle, which can be in a range from 0.2 degrees to 3 degrees. A taper, if present in the sidewalls of the backside contact trench 79, can be advantageously employed to facilitate the removal of sub-portions of the first metallic material portion 466 within the volume of the backside contact trench 79. The sidewalls of the insulator layers 32 are physically exposed after the anisotropic etch at the periphery of the backside contact trench 79.

In one embodiment, each first conductive material portion 466 comprises ruthenium, and is formed within a respective backside recess, and each second conductive material portion 471 comprises a material other than ruthenium. Each first conductive material portion 466 can be formed on a surface of a second conductive material portion 471. In one embodiment, each first conductive material portion 466 comprises a ruthenium portion and each second conductive material portion 471 consists essentially of tungsten.

Each adjoining set of a metallic liner 481, a second conductive material portion 471, and a first conductive material portion 466 collectively constitutes an electrically conductive layer 46. Each first conductive material portion 466 applies a compress stress to surrounding structures, and each second conductive material portion 471 applies a compressive stress to surrounding structures. Thus, the compressive stress generated by the second conductive material portions 471 and the tensile stress generated by the first conductive material portions 466 at least partially cancel each to at least partially cancel the stress on the substrate 9. Thus, the magnitude of the overall stress generated by the combination of a first conductive material portion 466 and a second conductive material portion 471 can be between the magnitude of the overall stress generated by a structure including the same volume as the combination and consisting of the tensile-stress-generating metallic material of the first conductive material portions 466, or consisting of the compressive-stress-generating metallic material of the second conductive material portions 471.

Another set of alternative processing steps may be performed in lieu of the processing steps of FIGS. 6B-6D. Referring to FIG. 8A, an alternating stack of at least tensile-stress-generating metallic material layer and at least compressive-stress-generating metallic material layer can be deposited after formation of the backside contact trench 79 and backside recesses 43. The alternating stack includes a combination of at least two tensile-stress-generating metallic material layers and at least one compressive-stress-generating metallic material layer, or a combination of at least two compressive-stress-generating metallic material layers and at least one tensile-stress-generating metallic material layer. The alternating stack of at least tensile-stress-generating metallic material layer and at least compressive-stress-generating metallic material layer can start with the tensile-stress-generating metallic material layer 461L illustrated in FIG. 6B, or can start with the compressive-stressgenerating metallic material layer 471L illustrated in FIG. 7A, which is formed on a contiguous metallic material layer 481L.

In an illustrative example, a first tensile-stress-generating metallic material layer 461L, a first compressive-stress-generating metallic material layer 471L, a second tensile-stress-generating metallic material layer 462L, and an optional compressive-stress-generating metallic material layer 472L are formed in the backside recesses 43. The first tensile-stress-generating metallic material layer 461L can be the same as the tensile-stress-generating metallic material layer 461L illustrated in FIG. 6B, and can be formed employing the same methods. The thickness of horizontal portions of the first tensile-stress-generating metallic material layer 461L can be in a range from 1 nm to 20 nm, although lesser and greater thicknesses can also be employed. In one embodiment, the first tensile-stress-generating metallic material layer 461L can be a ruthenium layer consisting essentially of ruthenium.

The first compressive-stress-generating metallic material layer 471L can be deposited employing the same deposition method as the deposition method employed to form the second conductive material portions 476 illustrated in FIG. 6D. The compressive-stress-generating material of the first compressive-stress-generating metallic material layer 471L can be, for example, tungsten, chromium, titanium, or a combination thereof. In one embodiment, the compressive-stress-generating material of the first compressive-stress-generating metallic material layer 471L can be tungsten deposited by reduction of $WF_6$ by hydrogen, and having a polycrystalline structure. The thickness of horizontal portions of the first compressive-stress-generating metallic material layer 471L can be in a range from 1 nm to 20 nm, although lesser and greater thicknesses can also be employed.

The second tensile-stress-generating metallic material layer 472L can be deposited employing the same deposition method as the deposition method employed to form the first conductive material portion 466 illustrated in FIG. 7C. The tensile-stress-generating material of the second tensile-stress-generating metallic material layer 472L can be, for example, ruthenium, gold, silver, copper, or a combination thereof. In one embodiment, the tensile-stress-generating material of the second compressive-stress-generating metallic material layer 472L can be ruthenium deposited by ALD. The thickness of horizontal portions of the second tensile-stress-generating metallic material layer 472L can be in a range from 1 nm to 20 nm, although lesser and greater thicknesses can also be employed. In one embodiment, the backside recesses may be filled with the combination of the first tensile-stress-generating metallic material layer 461L, the first compressive-stress-generating metallic material layer 471L, and the second tensile-stress-generating metallic material layer 462L. In another embodiment, a backside cavity may present in each backside recess after deposition of the second tensile-stress-generating metallic material layer 462L.

In an alternative embodiment, a combination of a contiguous metallic material layer 481 and a compressive-stress-generating metallic material layer 471L illustrated in FIG. 7A can be employed in lieu of depositing the compressive-stress-generating metallic material layer 471L. In this case, the second tensile-stress-generating metallic material layer 472L can be deposited directly on the combination of the contiguous metallic material layer 481 and the compressive-stress-generating metallic material layer 471L illustrated in FIG. 7A.

If a backside cavity may present in each backside recess after deposition of the second tensile-stress-generating metallic material layer 462L, a second compressive-stress-generating metallic material layer 472L can be deposited employing the same deposition method as the deposition method employed to form the second conductive material portions 476 illustrated in FIG. 6D. The compressive-stress-generating material of the second compressive-stress-generating metallic material layer 472L can be, for example, tungsten, chromium, titanium, or a combination thereof. The compressive-stress-generating material of the second compressive-stress-generating metallic material layer 472L can be the same as, or different from, the compressive-stress-generating material of the first compressive-stress-generating metallic material layer 471L. In one embodiment, the compressive-stress-generating material of the second compressive-stress-generating metallic material layer 472L can be tungsten deposited by reduction of $WF_6$ by hydrogen, and having a polycrystalline structure. The thickness of horizontal portions of the second compressive-stress-generating metallic material layer 472L can be in a range from 1 nm to 20 nm, although lesser and greater thicknesses can also be employed.

If the backside recesses are not completely filled after deposition of the second compressive-stress-generating metallic material layer 472L, at least one additional tensile-stress-generating metallic material layer and/or at least one additional compressive-stress-generating metallic material layer can be deposited in the backside cavities until all backside recesses are filled with conductive materials.

Figure 8B:
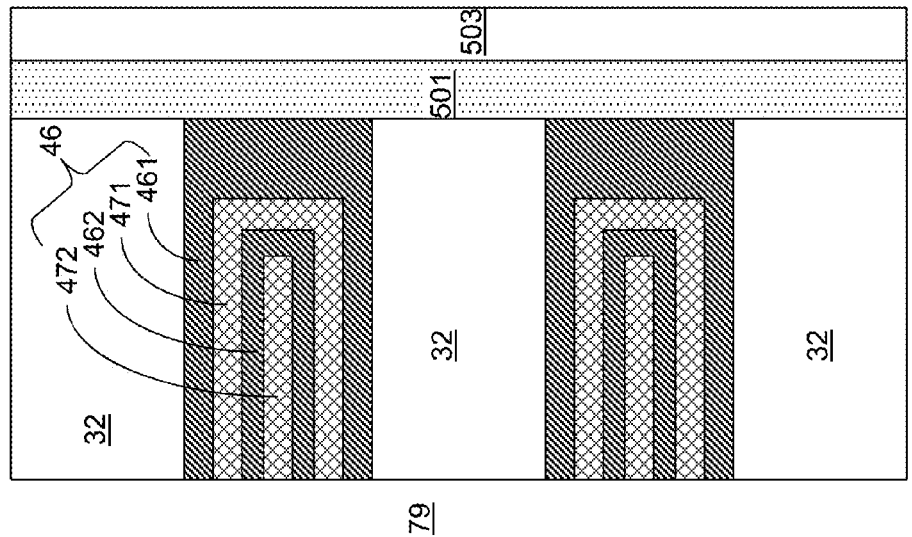
FIGS. 8A and 8B are sequential vertical cross-sectional views of a magnified region M in FIGS. 5A and 5B during formation of third exemplary electrically conductive layers according to a third embodiment of the present disclosure.
Figure 8A:
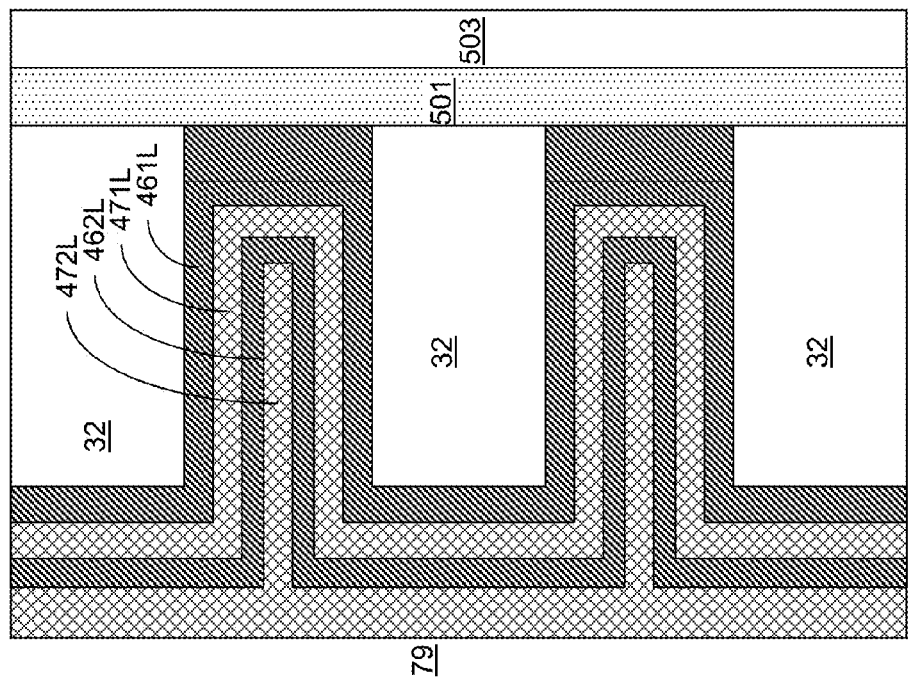

Referring to FIG. 8B, an anisotropic etch can be performed to remove sub-portions of the various material layers (461L, 471L, 462L, 472L) that protrude into the backside contact trench 79. In one embodiment, the backside contact trench 79 can be formed with a finite taper angle, which can be in a range from 0.2 degrees to 3 degrees. A taper, if present in the sidewalls of the backside contact trench 79, can be advantageously employed to facilitate the removal of the vertical portions of various material layers (461L, 471L, 462L, 472L) from the sidewalls of the insulator layers 32.

Each remaining portion of the first tensile-stress-generating metallic material layer 461L constitutes a first conductive material portion 461. Each remaining portion of the first compressive-stress-generating metallic material layer 471L constitutes a second material portion 471. Each remaining portion of the second tensile-stress-generating metallic material layer 462L constitutes a third conductive material portion 462. Each remaining portion of the second compressive-stress-generating metallic material layer 472L, if present, constitutes a fourth conductive material portion 472. Each remaining portion of any additional stress-generating metallic material layer, if present, constitutes an additional conductive material portion (not shown).

In this case, each sidewall of a conductive material portion (which can be a sidewall of any of the first conductive material portions 461, the second conductive material portions 471, the third conductive material portions 462, the optional fourth conductive material portion 472, and any additional conductive material portion, if present) that is physically exposed to the backside contact trench 79 can be substantially vertically coincident with a portion of sidewalls of the backside contact trench 79 located directly above, or directly underneath, the sidewall of the conductive material portion. Each adjoining combination of a first conductive material portions 461, a second conductive material portions 471, a third conductive material portions 462, an optional fourth conductive material portion 472, and any additional conductive material portion constitutes an electrically conductive layer 46 (having portions 461, 471, 462, and 472). Each electrically conductive layer 46 is deposited within one level of the stack, and does not adjoin other electrically conductive layer 46 located at any other level of the stack after formation of the electrically conductive layers 46.

Each first or third conductive material portion (461, 462) including a tensile-stress-generating metallic material applies a compress stress to surrounding structures, and each second or fourth (if present) conductive material portion (471, 472) applies a compressive stress to surrounding structures. Thus, the compressive stress generated by the compressive-stress-generating conductive material portions (471, 472) and the tensile stress generated by the tensile-stress-generating conductive material portions (461, 462) at least partially cancel each other. Thus, the magnitude of the overall stress generated by the combination of first through fourth conductive material portions (461, 471, 462, 472) within an electrically conductive layer 46 can be between the magnitude of the overall stress generated by a structure including the same volume as the combination and consisting of a tensile-stress-generating metallic material, or consisting of a compressive-stress-generating metallic material. The order of the tensile-stress and compressive-stress-generating metallic material in the backside recesses may also be reversed, such that each compressive-stress-generating metallic material is formed after rather than before each respective tensile-stress-generating metallic material.

Figure 9:
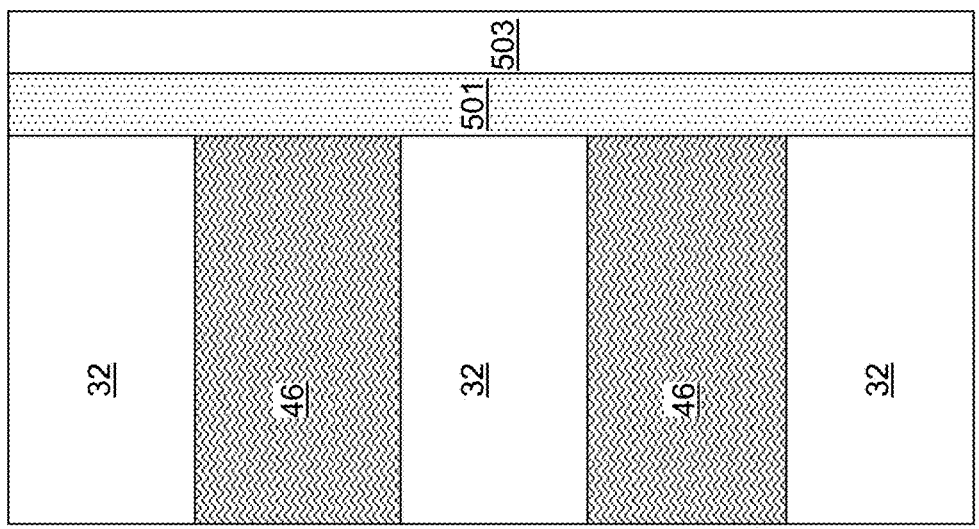
FIG. 9 is a vertical cross-sectional view of a magnified region M in FIGS. 5A and 5B after formation of fourth exemplary electrically conductive layers according to a fourth embodiment of the present disclosure.

Referring to FIG. 9, an anneal process can be optionally performed on the exemplary structure of the present disclosure that incorporate the structure of FIG. 6D, 7C or 8B. In this case, the tensile-stress-generating metallic material(s) and the compressive-stress-generating metallic material(s) within each electrically conductive layer 46 can interdiffuse to form partially mixed alloys having local variations in composition (i.e., intermetallic alloys having microscopically heterogeneous composition), or to form completely mixed alloys having a uniform composition throughout (i.e., intermetallic alloys having a homogeneous composition).

If a first conductive material portion (461 or 466) comprising a tensile-stress-generating metallic material and a second conductive material portion (471 or 476) comprising a compressive-stress-generating metallic material are present within each electrically conductive layers 46 prior to the anneal process, the electrically conductive layers 46 after the anneal can comprise an alloy of the first metallic material within the first conductive material portion (461 or 466) and the second metallic material within the second conductive material portion (471 or 476). If a ruthenium layer is employed as one of the material layers in the electrically conductive layers as illustrated in FIGS. 6D, 7C, and 8B, ruthenium is a component of the alloy in the electrically conductive layers 46 after the anneal. In one embodiment, the first metallic material within the first conductive material portion (461 or 466) can be ruthenium, and the second metallic material within the second conductive material portion (471 or 476) can be tungsten. In this case, the electrically conductive layers 46 can include an alloy of at least ruthenium and tungsten.

Figure 10:
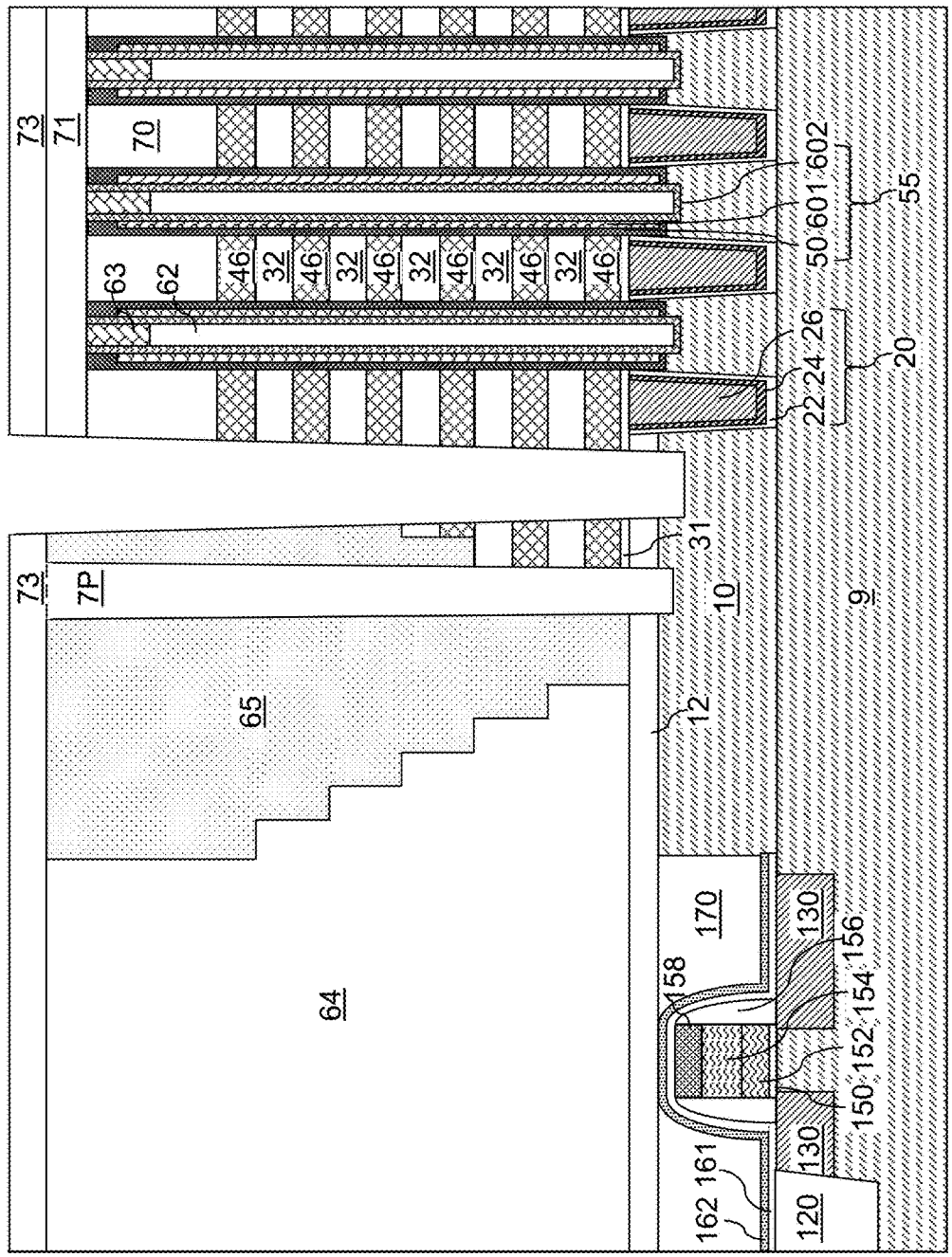
FIG. 10 is a vertical cross-sectional view of the exemplary structure after formation of electrically conductive lines according to an embodiment of the present disclosure.

Referring to FIG. 10, a plurality of electrically conductive layers 46 can be formed in the plurality of backside recesses 43. Thus, at least a portion of each sacrificial material layer 42 can be replaced with an electrically conductive layer 46, which is a conductive material portion. The electrically conductive layers 46 can have any type illustrated in FIG. 6D, 7C, 8B, or 9.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

Figure 11:
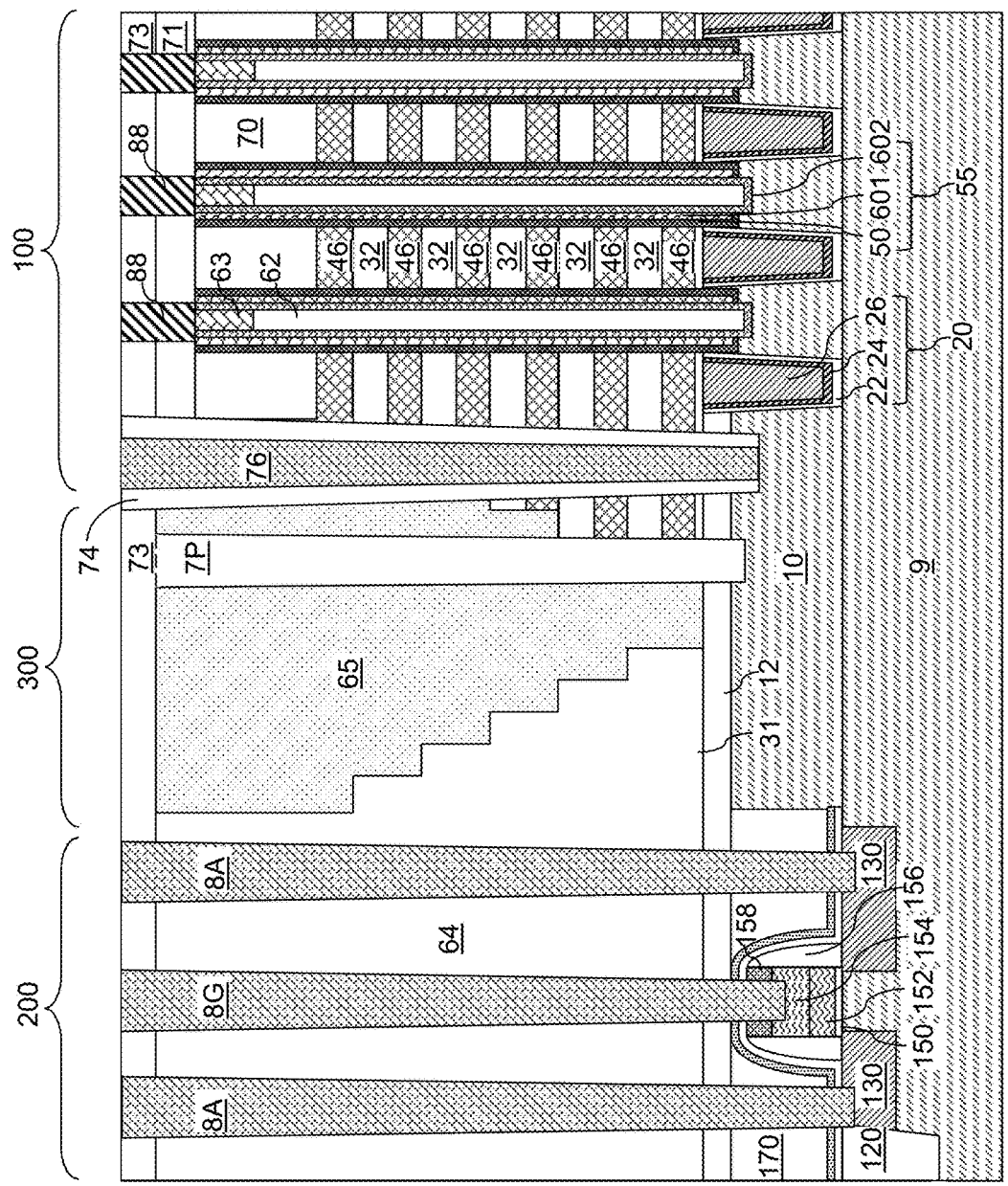
FIG. 11 is a vertical cross-sectional view of the exemplary structure after formation of a backside via insulating spacer and a backside contact via structure according to an embodiment of the present disclosure.

Referring to FIG. 11, an insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the exemplary structure (which can be, for example, the dielectric pillar material layer 73) and in the cavity laterally surrounded by the insulating spacer 74, and is lithographically patterned to form various openings in a peripheral device region. The locations and the shapes of the various openings are selected to correspond to electrical nodes of the semiconductor devices in the peripheral device region 200 to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The vertical extent of each gate via cavity, as measured from the top surface of the dielectric pillar material layer 73 to the bottom surface of the gate via cavity, can be less than the vertical distance between the top surface of the dielectric pillar material layer 73 and the topmost surface of the alternating plurality (32, 46) of the insulator layers 32 and the electrically conductive layers 46. The photoresist layer can be subsequently removed, for example, by ashing.

Another photoresist layer (not shown) can be applied over the exemplary structure, and can be lithographically patterned to form openings within the contact region 200 in which formation of contact via structures for the electrically conductive layers 46 is desired. Control gate contact via cavities can be formed through the retro-stepped dielectric material portion 65 by transfer of the pattern of the opening by an anisotropic etch. Each via cavity can vertically extend to a top surface of a respective electrically conductive layer 46.

In addition, another photoresist layer (not shown) can be applied over the exemplary structure, and can be lithographically patterned to form openings that overlie the array of drain regions 63 in the device region 100. Drain contact via cavities can be formed through the dielectric pillar material layer 73 and the at least one dielectric cap layer 71.

The cavity laterally surrounded by the insulating spacer 74, the various via cavities in the peripheral device region 200, the control gate contact via cavities in the contact region 300, and the drain contact via cavities in the device region 100 can be filled with a conductive material to form various contact via structures. For example, a backside contact via structure 76 can be formed in the cavity surrounded by the insulating spacer 74. A gate contact via structure 8G can be formed in each gate via cavity in the peripheral device region 200. An active region via structure 8A is formed in each active region via cavity in the peripheral device region 200. Drain contact via structures 88 can be formed in the drain contact via cavities in the device region 100. Further, control gate contact via structures (not shown) can be formed within each contact via cavity that extends to a top surface of the electrically conductive layers 46 in the contact region 300. Similarly, drain contact via structures 88 can be formed to provide electrical contact to the drain regions 63.

Figure 12A:
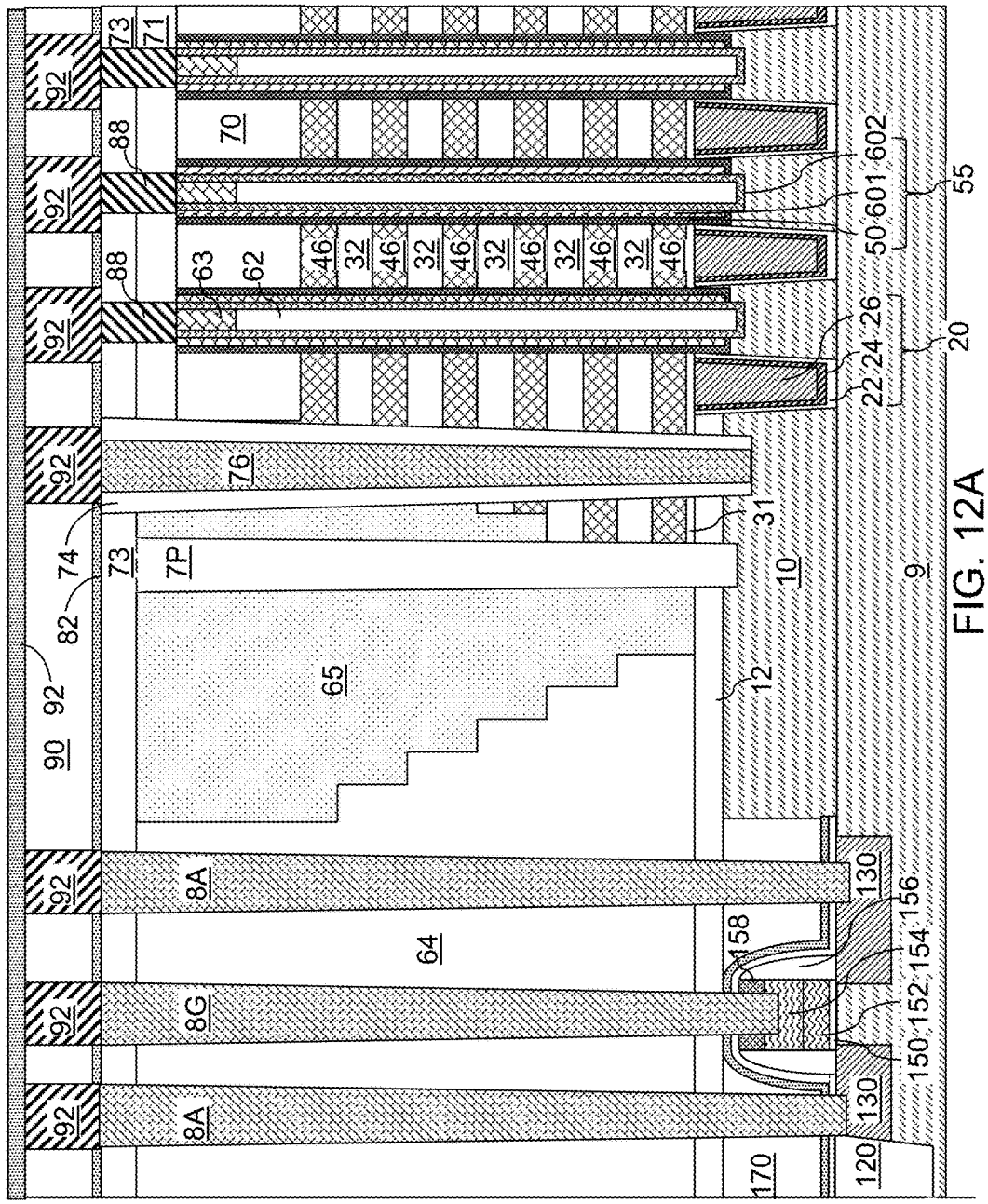
FIGS. 12A and 12B are vertical cross-sectional views of regions of the exemplary structure after formation of conductive line structures according to an embodiment of the present disclosure.
Figure 12B:
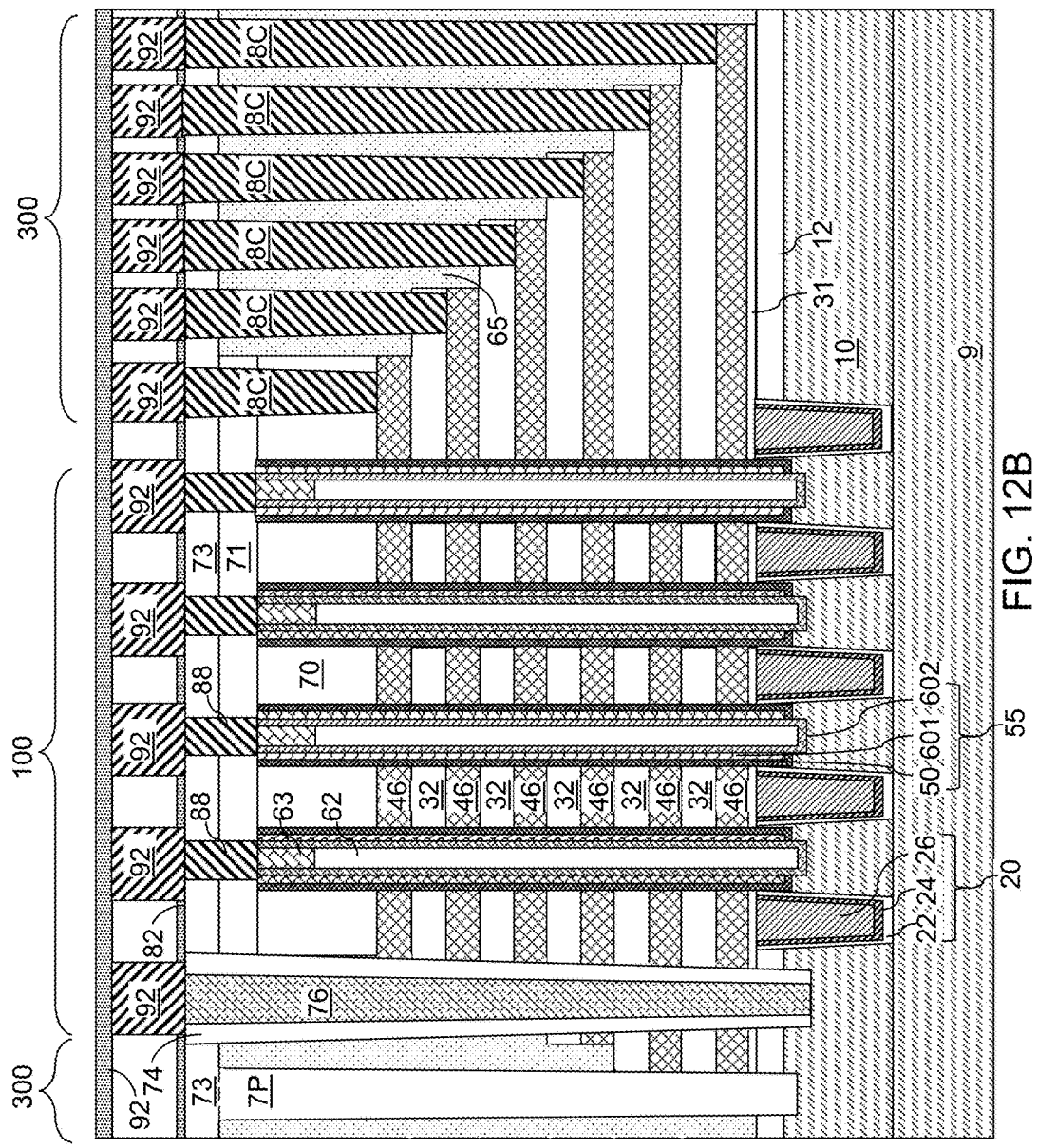

Referring to FIGS. 12A and 12B, an optional passivation layer 82 and a line-level dielectric layer 90 can be formed over the dielectric pillar material layer 73. The optional passivation layer 82 can include a low permeability material such as silicon nitride. The thickness of the passivation layer 82 can be in a range from 3 nm to 30 nm, although lesser and greater thicknesses can also be employed. The line-level dielectric layer 90 can include silicon oxide or organosilicate glass. The thickness of the line-level dielectric layer 90 can be in a range from 30 nm to 1,000 nm, although lesser and greater thicknesses can also be employed. Control gate contact via structures 8C can contact the electrically conductive layers 46.

Various conductive line structures 92 can be formed in the line-level dielectric layer 90 to provide electrical contact to the various contact via structures (76, 8G, 8A, 88, 8C). A subset of the electrically conductive layers 46 can function as control gate electrodes for the memory stack structures 55 in the device region. Optionally, at least one subset of the electrically conductive layers 46 can be employed as at least one drain select gate electrode and/or at least one source select gate electrode.

Additional metal interconnect structures (not shown) can be optionally formed, which can include at least one dielectric material layer, at least one conductive via structure, and at least one additional conductive line structure. The additional metal interconnect structure can be formed on the top surface of the conductive line structure 92 and the line-level dielectric layer 90.

The exemplary structure is a multilevel structure including a stack (32, 46) of an alternating plurality of electrically conductive layers 46 and insulator layers 32 located over a semiconductor substrate including the semiconductor material layer 10. An array of memory stack structures 55 can be located within memory openings through the stack (32, 46).

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 200 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

In a non-limiting illustrative example, the insulating layers 32 can comprise silicon oxide layers, the plurality of word lines 46 can comprise tungsten, ruthenium, a combination or an alloy of ruthenium and tungsten, or a combination of titanium nitride and tungsten, the at least one charge storage region can comprises a tunneling dielectric, a blocking dielectric layer, and either a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region 300. The plurality of word lines 46 extends from the device region 100 to the contact region 300. The backside contact via structure 76 can be a source line that extends through a dielectric insulated trench, i.e., the backside contact trench 79 filled with the dielectric spacer 74 and the backside contact via structure 76, in the stack to electrically contact the source region (not shown). The source region can be in contact with the horizontal portion of the semiconductor channel in an upper portion of the semiconductor material layer 10.

A drain line, as embodied as a conductive line structure 92 that contacts a drain contact via structure 88, electrically contacts an upper portion of the semiconductor channel (601, 602). As used herein, a first element "electrically contacts" a second element if the first element is electrically shorted to the second element. An array of drain regions 63 contacts a respective semiconductor channel (601, 602) within the array of memory stack structures 55. A top surface of the dielectric material layer, i.e., the insulating cap layer 70, can be coplanar with top surfaces of the drain regions 63.

Within the exemplary structure illustrated in FIGS. 12A and 12B, a memory film 50 and a semiconductor channel (601, 602) are located within a memory opening. In one embodiment, each of the electrically conductive layers 46 can comprise a first conductive material portion (461 or 466) including a tensile-stress-generating metallic material and a second conductive material portion (471 or 476) including a compressive-stress-generating metallic material as illustrated in FIGS. 6D, 7C, and 8B. In one embodiment, the first conductive material portion (461 or 466) can be a ruthenium portion. In one embodiment, the second conductive material portion (471 or 476) can comprise a material selected from W, Ti, and Cr.

In one embodiment, the second conductive material portion (471, 476) can be spaced from the insulator layers 32 and the memory film 50 by the first conductive material portion (461, 466) as illustrated in FIGS. 6D and 8B. In one embodiment, a vertical portion of the first conductive material portion (461, 466) can have a greater thickness than horizontal portions of the first conductive material portion (461, 466). In one embodiment, each electrically conductive layer 46 can further comprise a third conductive material portion 462 comprising another tensile-stress-generating metallic material, contacting a sidewall of the second conductive material portion 471, and laterally surrounding a vertical portion of the second conductive material portion 471 and a vertical portion of the first conductive material portion 461 as illustrated in FIG. 8B. In one embodiment, the third conductive material portion 462 can comprise a material selected from ruthenium, gold, silver, and copper.

In one embodiment, each electrically conductive layer 46 can comprise a metallic liner 481 in contact with a sidewall of the memory film 50, a bottom surface of an overlying insulator layer 32, and a top surface of an underlying insulator layer 32. An inner sidewall of the second conductive material portion 471 can be in contact with the metallic liner as illustrated in FIG. 7C.

In one embodiment, the first conductive material portion (461 or 466) can be a ruthenium portion consisting essentially of ruthenium. In this case, each of the electrically conductive layers 46 can comprise a ruthenium portion and a conductive material portion including a compressive-stress-generating metallic material (such as the second conductive material portion (471 or 476)). In one embodiment, the second conductive material portion (471 or 476) can be spaced from the insulator layers 32 and the memory film 50 by the ruthenium portion. In one embodiment, a first sidewall of the ruthenium portion can contact a portion of an outer sidewall of the memory film 50, and a second sidewall of the ruthenium portion can contact an inner sidewall of the second conductive material portion (471 or 476) as illustrated in FIG. 6D or 8B. In one embodiment, the ruthenium portion contacts an entire bottom surface of an overlying insulator layer 32 and an entire top surface of an underlying insulator layer 32. In one embodiment, a vertical portion of the ruthenium portion can have a greater thickness than horizontal portions of the ruthenium portion.

Use of ruthenium as a tensile-stress-generating material layer has an additional advantage of reducing the resistance of the electrically conductive layers 46 with respect to structures that employ a combination of a metallic liner layer and a tungsten seed layer derived from reduction of $WF_6$ with silane, dichlorosilane, or diborane. Titanium nitride has a bulk resistivity of about 100 microOhm-cm, silane-reduced amorphous tungsten has a bulk resistivity of about 50 microOhm-cm, ruthenium deposited by ALD has a bulk resistivity of about 7.1 microOhm-cm, and hydrogen-reduced polycrystalline tungsten has a bulk resistivity of about 5.1 microOhm-cm. Thus, use of a ruthenium layer that can be deposited directly on dielectric material layer can lower the resistivity of a conductive line compared with the combination of a titanium nitride layer and a tungsten seed layer formed by reduction $WF_6$ by silane, dichlorosilane, or diborane.

Figure 13:
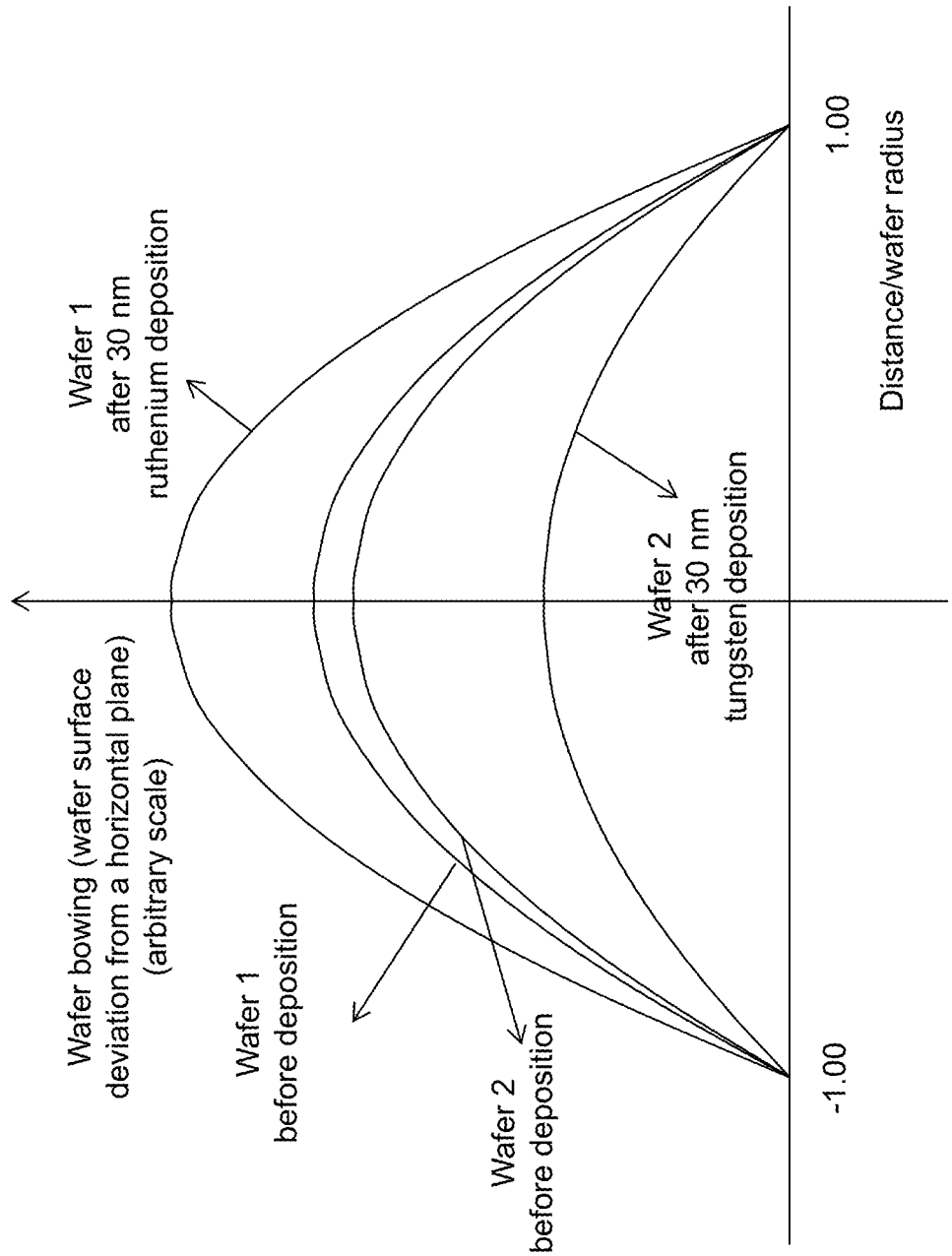
FIG. 13 is a schematic graph illustrating changes in bowing due to deposition of a ruthenium layer or a tungsten layer.

Referring to FIG. 13, a graph schematically illustrates the test results on semiconductor substrate. Optical interferometry was employed to measure bowing of wafers employed for the test. A first wafer (wafer 1) having an initial bowing (represented by the curve marked "Wafer 1 before deposition") was provided, and a ruthenium layer having a thickness of 30 nm was deposited. The bowing of the first wafer after deposition of the ruthenium layer was measured. The bowing of the first wafer after deposition of the ruthenium layer is shown by a curve labeled "Wafer 1 after 30 nm ruthenium deposition." The increase in the tensile stress bowing of the first wafer due to the presence of the ruthenium layer shows that the deposited ruthenium layer applies tensile stress to the first wafer.

A second wafer (wafer 2) having an initial bowing (represented by the curve marked "Wafer 2 before deposition") was provided, and a tungsten layer having a thickness of 30 nm was deposited. The bowing of the second wafer after deposition of the tungsten layer was measured. The bowing of the second wafer after deposition of the tungsten layer is shown by a curve labeled "Wafer 2 after 30 nm tungsten deposition." The increase in the compressive stress bowing of the first wafer due to the presence of the tungsten layer shows that the deposited tungsten layer applies compressive stress to the first wafer. As evidenced by the opposite directions of wafer bowing, the tungsten layer and the ruthenium layer apply opposite types of stress to the substrate.

Figure 14:
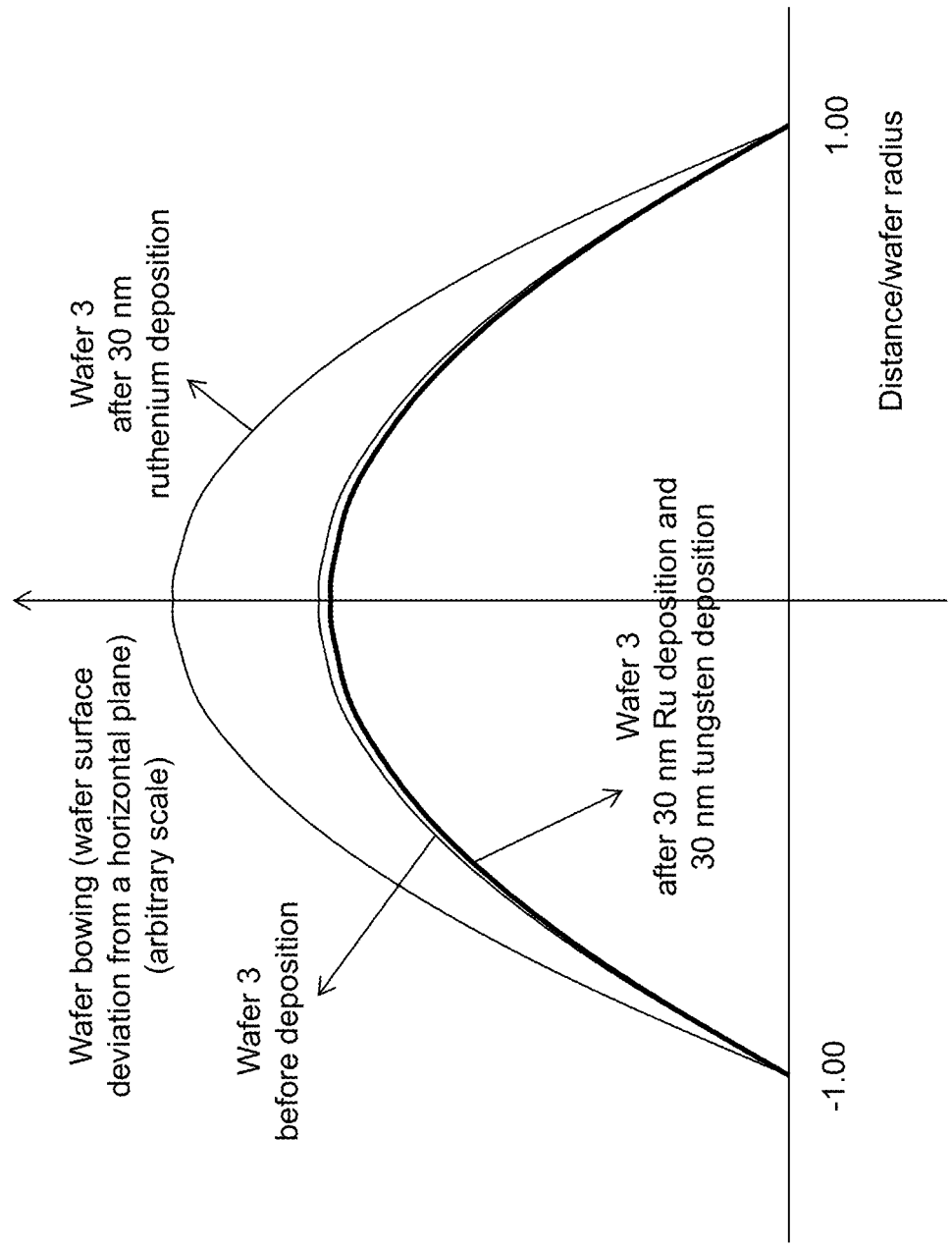
FIG. 14 is a schematic graph illustrating changes in bowing due to deposition of a stack of a ruthenium layer and a tungsten layer.

FIG. 14 illustrates cancellation of the opposite types of stress from a ruthenium layer and a tungsten layer in case a stack including a ruthenium layer and a tungsten layer is formed on a third wafer (wafer 3). The initial bowing of the third wafer is represented by the curve marked "Wafer 3 before deposition". A ruthenium layer having a thickness of 30 nm and a tungsten layer having a thickness of 30 nm was deposited. The bowing of the third wafer was measured, and is represented by the curve labeled "Wafer 3 after 30 nm Ru deposition and 30 nm tungsten deposition." The change in the bowing of the third wafer due to deposition of the stack of the ruthenium layer and the tungsten layer is insignificant because the opposite types of stress generated by the ruthenium layer and the tungsten layer nearly cancel each other. By selecting the thicknesses of the ruthenium layer and the tungsten layer, the net stress applied by the stack can be made substantially equal to zero.

In general, two metallic layers generating opposite types of stress can be combined into a stack with a suitable thickness ratio, or a suitable volume ratio, therebetween so that the net stress applied by the stack is substantially zero. Further, the electrical resistivity of ruthenium is on par with the electrical resistivity of hydrogen-reduced tungsten, so that use of ruthenium in lieu of hydrogen-reduced tungsten does not impair the overall conductivity of a conductive line. In addition, the electrical resistivity of ruthenium is much less than the electrical resistivity of silane-reduced tungsten or diborane-reduced tungsten, so that use of ruthenium in lieu of silane-reduced tungsten or diborane-reduced tungsten increases the overall conductivity of a conductive line.

In one embodiment, the thicknesses of two metallic materials applying opposite types of stress can be selected such that there is a non-zero net stress applied to the structure which a stack of the two metallic material layers is attached to, or embedded in. For instance, after word lines embodied as the electrically conductive layers 46 are formed, there a subsequent metallization step may be performed, which introduces compressive stress to the substrate. For example, the tungsten backside contact via structure 76 (e.g., source line) that extends through the backside contact trench 79 may also introduce compressive stress to the substrate.

In one embodiment, the thicknesses of the various components of the electrically conductive layers 46 can be selected in such a way that the electrically conductive layers 46 apply a net tensile stress to the substrate, and the magnitude of the net tensile stress matches the magnitude of the compressive stress to be subsequently introduced during the metallization step. In this case, the tensile stress of the electrically conductive layers 46 can be compensated by the additional compressive stress introduced by the metallization step (e.g., the source line 76 formation step). The net stress to the substrate after the metallization step can be substantially equal to zero. For example, the net tensile stress on the substrate provided by the ruthenium portions of the electrically conductive layer 46 (e.g., word line that functions as a common control gate electrode layers) may be selected to offset the net compressive stress provided on the substrate by the sum of the tungsten portions of layers 46 and the tungsten source lines 76.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   a stack of alternating layers comprising insulator layers and electrically conductive layers and located over a top surface of a substrate;
   a semiconductor channel, wherein at least one end portion of the semiconductor channel extends substantially perpendicular to the top surface of the substrate; and
   a memory film located adjacent to the semiconductor channel;
   wherein:
   each of the electrically conductive layers comprises a first conductive material portion including a tensile-stress-generating metallic material and a second conductive material portion including a compressive-stress-generating metallic material;
   the first conductive material portion comprises a vertical portion and a pair of horizontal portions adjoined to the vertical portion and laterally extending from the vertical portion and vertically spaced from each other;
   the vertical portion of the first conductive material portion has a first thickness between a pair of vertical sidewalls including a first sidewall and a second sidewall;
   each of the pair of horizontal portions of the first conductive material portion has a second thickness between a respective pair of substantially horizontal surfaces; and
   the first thickness is greater than the second thickness.

2. The three-dimensional memory device of claim 1, wherein:
   the first conductive material portion comprises a material selected from ruthenium, gold, silver or copper; and
   the second conductive material portion comprises a material selected from tungsten, titanium or chromium.

3. The three-dimensional memory device of claim 2, wherein:
   the first conductive material portion comprises ruthenium; and
   the second conductive material portion comprises tungsten.

4. The three-dimensional memory device of claim 2, wherein:
   the first sidewall of the first conductive material portion contacts a portion of an outer sidewall of the memory film; and
   the second sidewall of the first conductive material portion contacts an inner sidewall of the second conductive material portion.

5. The three-dimensional memory device of claim 1, wherein the second conductive material portion is spaced from the insulator layers and the memory film by the first conductive material portion.

6. The three-dimensional memory device of claim 1, wherein each of the electrically conductive layers further comprises a third conductive material portion comprising another tensile-stress-generating metallic material contacting a sidewall of the second conductive material portion.

7. The three-dimensional memory device of claim 6, wherein the third conductive material portion comprises a material selected from ruthenium, gold, silver or copper.

8. The three-dimensional memory device of claim 1, further comprising a metallic liner in contact with a sidewall of the memory film, a bottom surface of an overlying insulator layer, and a top surface of an underlying insulator layer, wherein an inner sidewall of the second conductive material portion is in contact with the metallic liner.

9. The three-dimensional memory device of claim 1, wherein the electrically conductive layers comprise:
   a first control gate electrode located in a first device level; and
   a second control gate electrode located in a second device level that is located below the first device level.

10. The three-dimensional memory device of claim 9, wherein:
    the first conductive material portion comprises a ruthenium portion; and
    each ruthenium portion is located within one device level of the stack, and is disjoined from other ruthenium portions located at any other device level of the stack.

11. The three-dimensional memory device of claim 10, wherein each ruthenium portion contacts an entire bottom surface of an overlying insulator layer and an entire top surface of an underlying insulator layer.

12. The three-dimensional memory device of claim 1, wherein the memory film comprises a stack including a blocking dielectric, at least one charge storage element, and a tunneling dielectric.

13. The three-dimensional memory device of claim 1, wherein:
    the three-dimensional memory device comprises a vertical NAND device located in a device region; and
    the electrically conductive layers comprise, or are electrically connected to a respective word line of the NAND device.

14. The three-dimensional memory device of claim 13, wherein:
    the device region comprises:
    a plurality of semiconductor channels, wherein at least one end portion of each of the plurality of semiconductor channels extends substantially perpendicular to the top surface of the substrate;
    a plurality of charge storage regions, each charge storage region located adjacent to a respective one of the plurality of semiconductor channels; and a plurality of control gate electrodes having a strip shape extending substantially parallel to the top surface of the substrate;

the plurality of control gate electrodes comprise at least a first control gate electrode located in a first device level and a second control gate electrode located in a second device level;

the electrically conductive layers in the stack comprise or are in electrical contact with the plurality of control gate electrodes and extend from the device region to a contact region including a plurality of electrically conductive via connections; and the substrate comprises a silicon substrate containing a driver circuit for the NAND device.

15. The three-dimensional memory device of claim 1, wherein the first sidewall is in physical contact with the memory film.

16. The three-dimensional memory device of claim 15, wherein the second sidewall is in physical contact with a sidewall of the second conductive material portion.

17. The three-dimensional memory device of claim 1, wherein:

the insulating layers comprise silicon oxide; and the memory film comprises a blocking dielectric comprising a material less hydrophilic than silicon oxide and contacting the first conductive material portion.

18. The three-dimensional memory device of claim 17, wherein the blocking dielectric comprise silicon nitride.

19. The three-dimensional memory device of claim 17, wherein the first conductive material portion consists essentially of ruthenium.

20. The three-dimensional memory device of claim 1, wherein:

the first thickness is in a range from 3 nm to 12 nm; and the second thickness is in a range from 1 nm to 7 nm.

21. The three-dimensional memory device of claim 1, wherein:

a memory opening extends through an entirety of the alternating stack;

the memory film comprises a blocking dielectric contacting an entirety of a sidewall of the memory opening that extends from a bottommost layer of the alternating stack to a topmost layer of the alternating stack.

22. The three-dimensional memory device of claim 1, wherein the second conductive material portion comprises a vertical portion and a pair of horizontal portions adjoined to the vertical portion of the second conductive material portion and laterally extending from the vertical portion of the second conductive material portion and vertically spaced from each other.

23. The three-dimensional memory device of claim 22, wherein:

each of the electrically conductive layers further comprises a third conductive material portion; and the third conductive material portion comprises a vertical portion and a pair of horizontal portions adjoined to the vertical portion of the third conductive material portion and laterally extending from the vertical portion of the third conductive material portion and vertically spaced from each other.

24. The three-dimensional memory device of claim 23, wherein the third conductive material portion comprises another tensile-stress-generating metallic material.

25. The three-dimensional memory device of claim 24, wherein the another tensile-stress-generating metallic material is a material selected from ruthenium, gold, silver or copper.

26. The three-dimensional memory device of claim 25, wherein the first and third conductive material portions consist essentially of ruthenium.

27. The three-dimensional memory device of claim 26, wherein the second conductive material portion consists essentially of tungsten.

* * * * *